United States Patent [19]
Takeda

[11] Patent Number: 5,290,659
[45] Date of Patent: * Mar. 1, 1994

[54] LIGHT-SENSITIVE MATERIAL COMPRISING LIGHT-SENSITIVE LAYER, POLYMERIZABLE LAYER AND IMAGE FORMATION ACCELERATING LAYER PROVIDED ON SUPPORT

[75] Inventor: Keiji Takeda, Kanagawa, Japan

[73] Assignee: Fuji Photo Film Co., Ltd., Kanagawa, Japan

[*] Notice: The portion of the term of this patent subsequent to Jun. 16, 2009 has been disclaimed.

[21] Appl. No.: 727,676

[22] Filed: Jul. 10, 1991

[30] Foreign Application Priority Data

Nov. 27, 1990 [JP] Japan .................................. 2-326260

[51] Int. Cl.[5] ................................................. G03C 5/54
[52] U.S. Cl. .................................... 430/203; 430/202; 430/205
[58] Field of Search ......................... 430/202, 203, 205

[56] References Cited

U.S. PATENT DOCUMENTS

| | | | |
|---|---|---|---|
| 4,390,612 | 6/1983 | Rutledge | 430/202 |
| 4,547,450 | 10/1985 | Maeda et al. | 430/202 |
| 4,629,676 | 12/1986 | Hayakawa et al. | 430/203 |
| 4,649,098 | 10/1987 | Takeda | 430/202 |
| 4,797,343 | 1/1989 | Nakamura | 430/203 |
| 4,897,335 | 1/1990 | Kakimi | 430/203 |
| 4,902,599 | 2/1990 | Yamamoto et al. | 430/203 |
| 4,985,339 | 1/1991 | Koizumi et al. | 430/270 |
| 5,001,032 | 3/1991 | Katayama et al. | 430/203 |
| 5,122,443 | 6/1992 | Takeda | 430/271 |

*Primary Examiner*—Richard L. Schilling
*Attorney, Agent, or Firm*—Sughrue, Mion, Zinn, Macpeak & Seas

[57] ABSTRACT

A light-sensitive material contains silver halide, a reducing agent and an ethylenically unsaturated polymerizable compound or/and a cross-linkable polymer. According to the present invention, the light-sensitive material comprises a support and at least three image forming functional layers. The layers include a light-sensitive layer, a polymerizable layer and an image formation accelerating layer. The light-sensitive layer contains silver halide. The polymerizable layer contains the ethylenically unsaturated polymerizable compound or/and the cross-linkable polymer. The image formation accelerating layer contains a component having a function of accelerating image formation. The component is selected from a reducing agent, a base, a base precursor and a heat development accelerator. The uppermost layer of the light-sensitive material preferably contains a polyvinyl alcohol having a saponification degree of not less than 70%. The light-sensitive material of the present invention is heat-developable. The present invention is based on a new discovery that a light-sensitive material comprising three or more image forming functional layers can be developed. An image forming method using the light-sensitive material is also disclosed.

19 Claims, 11 Drawing Sheets

Fig. 2-A
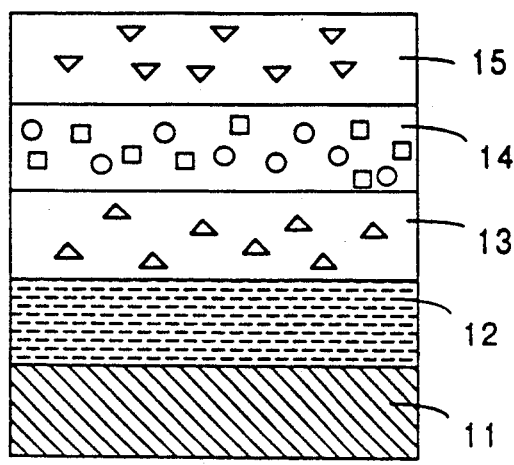
FIG. 2-B
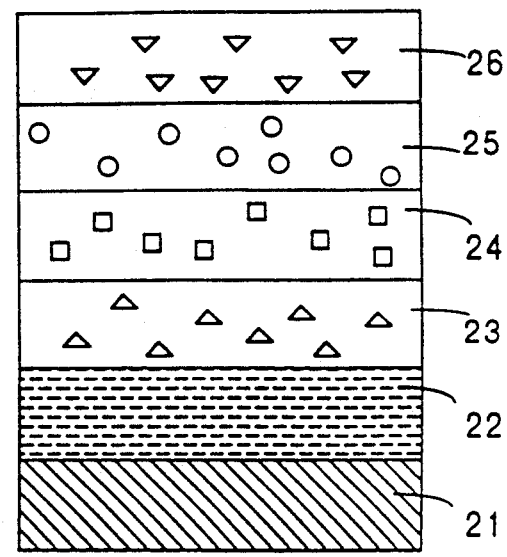
FIG. 2-C
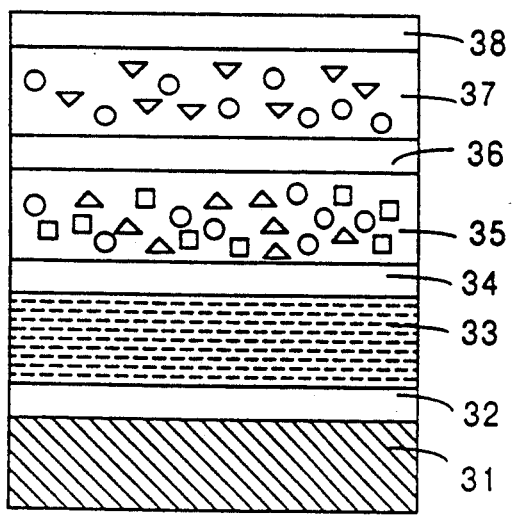

FIG. 3-A
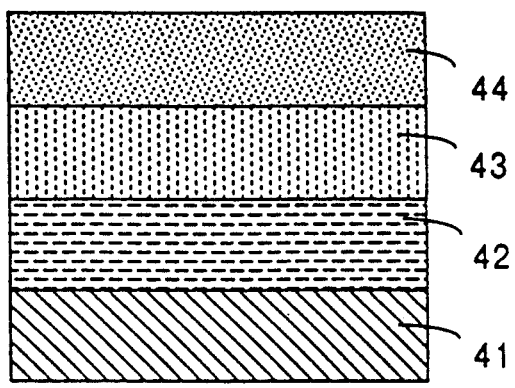
FIG. 3-B
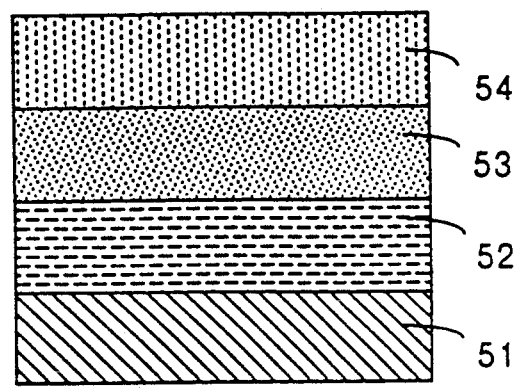
FIG. 3-C
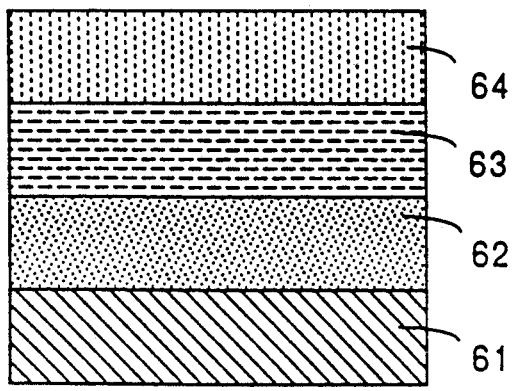

FIG. 4-A
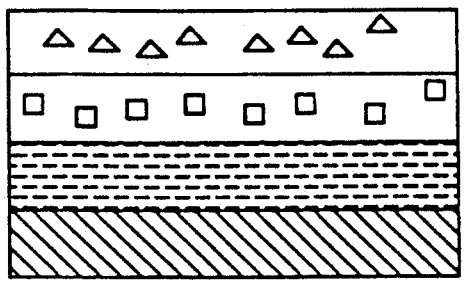
FIG. 4-B
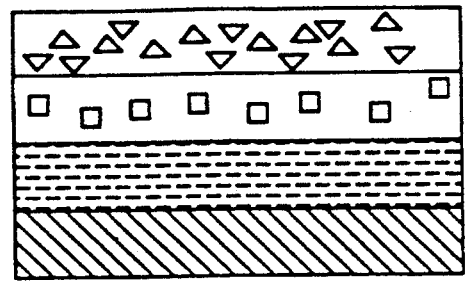
FIG. 4-C
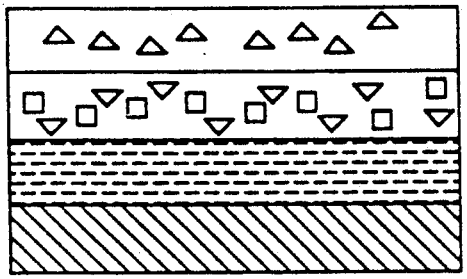
FIG. 4-D
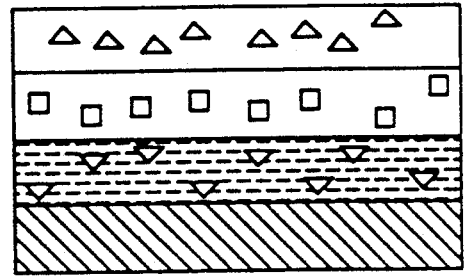
FIG. 4-E
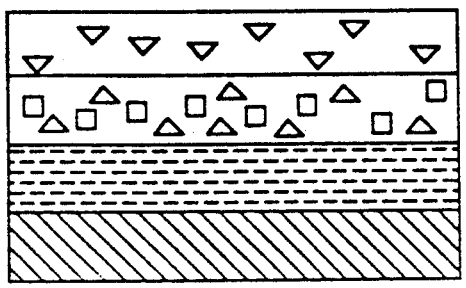
FIG. 4-F
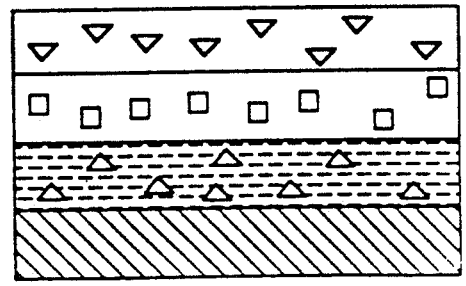

FIG. 5-A
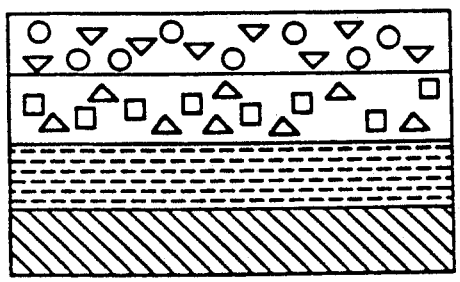
FIG. 5-B
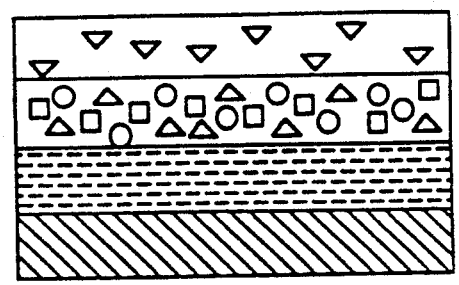
FIG. 5-C
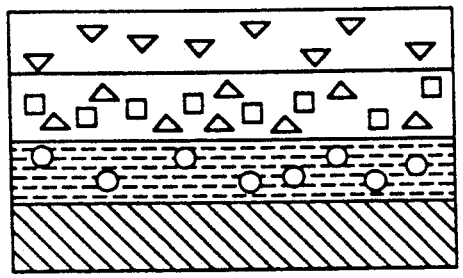
FIG. 5-D
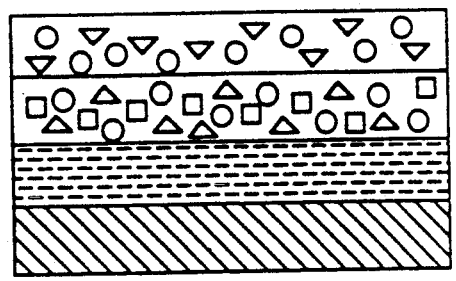
FIG. 5-E
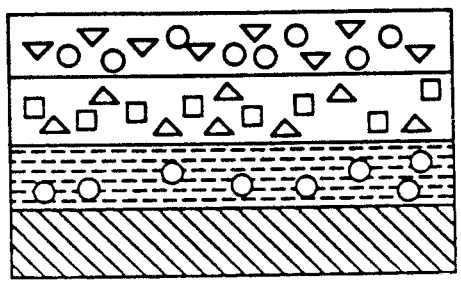
FIG. 5-F
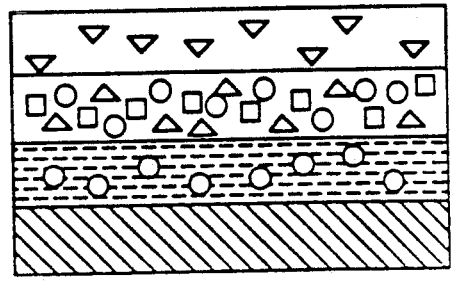

FIG. 6-A
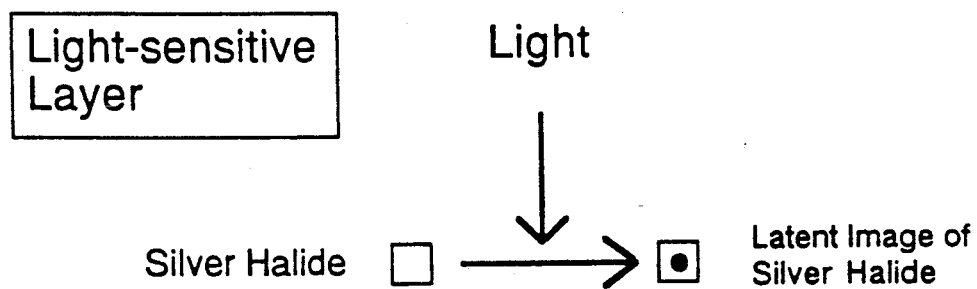

FIG. 7-A
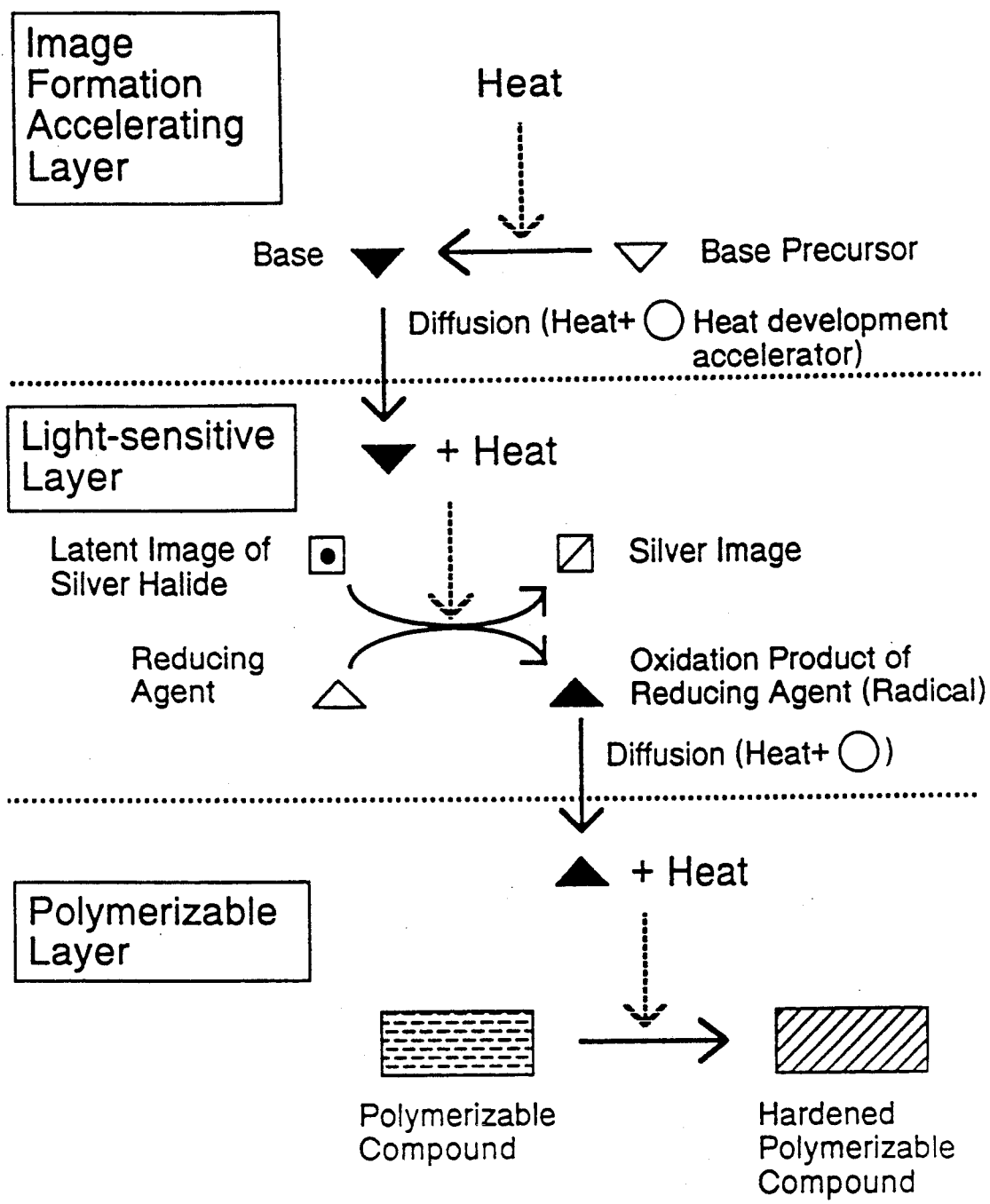

FIG. 9-A
(Prior Art)
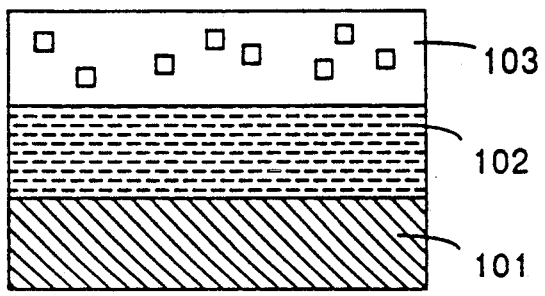
FIG. 9-B
(Prior Art)
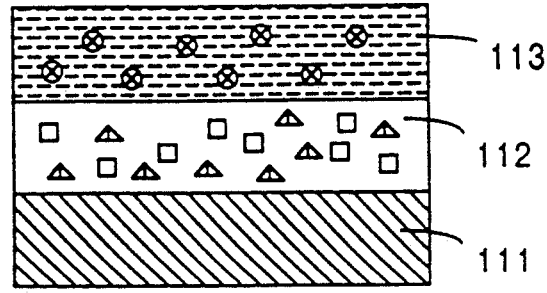
FIG. 9-C
(Prior Art)
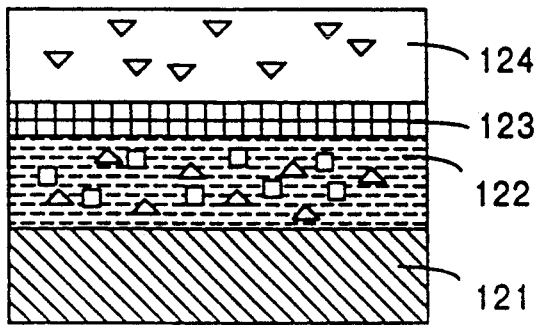

LIGHT-SENSITIVE MATERIAL COMPRISING LIGHT-SENSITIVE LAYER, POLYMERIZABLE LAYER AND IMAGE FORMATION ACCELERATING LAYER PROVIDED ON SUPPORT

FIELD OF THE INVENTION

The present invention relates to a light-sensitive material which contains silver halide, a reducing agent and an ethylenically unsaturated polymerizable compound or/and a cross-linkable polymer. The invention also relates to an image forming method using the light-sensitive material.

BACKGROUND OF THE INVENTION

An image forming method using a light-sensitive material which contains silver halide, a reducing agent and a polymerizable compound is disclosed Japanese Patent Publication No. 45(1970)-11149 (corresponding to U.S. Pat. No. 3,697,275, German Patent No. 1720665 and British Patent No. 1131200). The method comprises the steps of imagewise exposing to light the light-sensitive material and developing the material by a developing solution to imagewise harden the polymerizable compound so as to form a polymer image. In the method, the polymerization is caused by a radical of an oxidation product of the reducing agent, which is formed by the development of the silver halide.

On the other hand, another image forming method which employs a dry development process is disclosed in Japanese Patent Publication No. 61(1986)-69062 or No. 61(1986)-73145 (the contents of these two publications are described in U.S. Pat. No. 4,629,676 and European Patent Provisional Publication No. 0174634A). The method comprises imagewise exposing a light-sensitive material and heating the material to imagewise polymerize the polymerizable compound so as to form a polymer image. Further, Japanese Patent Provisional Publication No. 64(1989)-17047 (corresponding to U.S. Pat. No. 4,985,339) discloses a light-sensitive material which is heat-developable and is advantageously used in preparation of a printing plate.

In the above-mentioned image forming methods, silver halide, a reducing agent and a polymerizable compound are essential components. Further, a component having a function of accelerating image formation such as a base, a base precursor and a heat development accelerator has been preferably used.

So far these image forming functional components have usually been contained in a single layer (light-sensitive layer). In other words, the image forming functional components are scarcely separated into two layers. The following three embodiments (A), (B) and (C) are all the known multi-layered embodiments.

(A) One embodiment is a light-sensitive material wherein silver halide is separated from a polymerizable compound, which is disclosed in Japanese Patent Provisional Publication No. 58(1983)-121031 (corresponding to U.S. Pat. No. 4,547,450 and German Patent Provisional Publication No. 3300817A).

FIG. 9-A is a sectional view schematically illustrating the light-sensitive material disclosed in Japanese Patent Provisional Publication No. 58(1983)-121031. As is shown in FIG. 9-A, the light-sensitive material comprises a support (101), a polymerizable layer (102) containing the polymerizable compound and a light-sensitive layer (103) (silver halide photographic emulsion layer) containing the silver halide ($\square$) in the order. The reducing agent may be contained in the light-sensitive material. However, the reducing agent is usually contained in a developing solution, since the image forming method disclosed in Japanese Patent Provisional Publication No. 58(1983)-121031 employs a wet development process.

In the light-sensitive material separately having a light-sensitive layer and a polymerizable layer, it is essential for image formation that the radical of the oxidized reducing agent can be transferred from the light-sensitive layer to the polymerizable layer. As is described in Japanese Patent Provisional Publication No. 58(1983)-121031 (at column 2, lines 46–53 in U.S. Pat. No. 4,547,450), considering the instability of radicals, it is surprising that a radical formed in the light-sensitive layer diffused into another layer to initiate polymerization.

The image forming method disclosed in Japanese Patent Provisional Publication No. 58(1983)-121031 employs a wet development process using a developing solution, as is mentioned above. Accordingly, the developing solution permeates the light-sensitive layer and the polymerizable layer at the development process. Further, the reducing agents disclosed in the publication are soluble in water. Therefore, the radical of the oxidized reducing agent formed in the light-sensitive layer is transferred to the polymerizable layer with the developing solution. In other words, water contained in the developing solution functions as a medium or carrier of the radical.

As is mentioned above, the wet development process is the major promise of the separation in the disclosure of Japanese Patent Provisional Publication No. 58(1983)-21031.

(B) In the dry and heat development process, the applicant has noted that a reducing agent itself can be transferred between two layers. Therefore, the applicant has proposed a light-sensitive material wherein silver halide is separated from a polymerizable compound so long as the reducing agent itself functions as a polymerization inhibitor in an image forming method, as is disclosed in FIG. 2 of Japanese Patent Provisional Publication No. 61(1986)-75342 (which corresponds to FIG. 2 of U.S. Pat. No. 4,649,098).

FIG. 9-B is a sectional view schematically illustrating the light-sensitive material disclosed in Japanese Patent Provisional Publication No. 61(1986)-75342. As is shown in FIG. 9-B, the light-sensitive material comprises a support (111), a light-sensitive layer (112) containing silver halide ($\square$) and a reducing agent ($\blacktriangle$) having the above-mentioned specific function and a photopolymerizable layer (113) containing a polymerizable compound and a photopolymerization initiator ($\otimes$) in the order.

But, the radical of the oxidized reducing agent is much less stable than the reducing agent itself as is described in Japanese Patent Provisional Publication No. 58(1983)-121031. Accordingly, it has not yet been considered nor tried at all to transfer the radical by heat between two layers.

(C) Japanese Patent Provisional Publication No. 62(1987)-253140 (corresponding to U.S. Pat. No. 4,797,343) discloses a light-sensitive material wherein a base or base precursor is contained in a layer different from the light-sensitive layer. A barrier layer is preferably provided between the light-sensitive layer and the layer containing the base or base precursor. The barrier layer keeps the base or base precursor from the light-sensitive layer, and when heated allows transmission of the base or base precursor. Accordingly, the barrier layer is not the image forming functional layer.

FIG. 9-C is a sectional view schematically illustrating the light-sensitive material (having the barrier layer) disclosed in Japanese Patent Provisional Publication No. 61(1986)-75342. As is shown in FIG. 9-C, the light-sensitive material comprises a support (121), a light-sensitive layer (122) containing silver halide (□), a reducing agent (Δ), a barrier layer (123) having the above-mentioned function and a layer (124) containing a base or base precursor (∇) in the order.

The light-sensitive material disclosed in Japanese Patent Provisional Publication No. 61(1986)-75342 is based on the discovery that the base or base precursor can be transferred between two layers. The separated component was limited to the base or base precursor, since it was not discovered that the components other than the base or base precursor can be transferred between two layers.

The known multi-layered light-sensitive materials are limited to the above-described embodiments (A), (B) and (C) for the following reasons (1) and (2).

(1) In order to separate an image forming functional component of the light-sensitive material, the component must be transferred between two layers at a development process. It was discovered that a few components can be transferred between two layers, as is mentioned above. But, most of the components were indefinite with respect to the transference.

(2) The multi-layered light-sensitive material has a disadvantage that the process for preparation of the material is rather complicated. Accordingly, the multi-layered light-sensitive material is of no value without an advantage which can compensate the disadvantage. The advantage is merely found in the above-described three embodiments.

For the same reasons as mentioned above, a light-sensitive material having three or more image forming functional layers have not yet been proposed at all.

SUMMARY OF THE INVENTION

According to study of the applicant, the radical of the oxidized reducing agent is surprisingly transferred by heat between two layers (namely from the light-sensitive layer to the polymerizable layer). This discovery of the applicant makes it possible to separate the light-sensitive layer and the polymerizable layer even in the method employing a dry development process.

The applicant has recently proposed a heat-developable light-sensitive material having two image forming functional layers and an image forming method employing the same (cf., U.S. patent application Ser. No. 07/607,440 filed on Oct. 31, 1990 now U.S. Pat. No. 5,122,443 and European Patent Publication No. 0426192A published on May 8, 1991).

According to further study of the applicant, various components of the light-sensitive material can be transferred between layers, even if the components are separated into three or more layers. Furthermore, the applicant notes various merits of a light-sensitive material having three or more image forming functional layers.

An object of the present invention is to provide a light-sensitive material which has a high sensitivity, and gives a polymer image of high mechanical strength.

Another object of the invention is to provide a light-sensitive material which is improved in the preservability.

A further object of the invention is to provide an image forming method which employs a light-sensitive material in which image forming functional components are separated into three or more layers.

A furthermore object of the invention is to provide a light-sensitive material which is advantageously used as a presensitized printing plate and an image forming method which is advantageously used in preparation of a printing plate.

There is provided by the present invention a light-sensitive material which contains silver halide, a reducing agent and an ethylenically unsaturated polymerizable compound or/and a cross-linkable polymer, wherein the light-sensitive material comprises a support and at least three image forming functional layers including a light-sensitive layer, a polymerizable layer and an image formation accelerating layer, said light-sensitive layer containing silver halide, said polymerizable layer containing the ethylenically unsaturated polymerizable compound or/and the cross-linkable polymer, and said image formation accelerating layer containing a component having a function of accelerating image formation which is selected from a reducing agent, a base, a base precursor and a heat development accelerator.

The polymerizable layer is preferably arranged between the support and the light-sensitive layer. It is more preferred that the light-sensitive material comprises the support, the polymerizable layer, the light-sensitive layer, and the image formation accelerating layer in the order. Further, the image formation accelerating layer preferably contains the base precursor.

There is also provided by the invention an image forming method which comprises the steps of:

imagewise exposing to light a light-sensitive material which contains silver halide, a reducing agent, an ethylenically unsaturated polymerizable compound or/and a cross-linkable polymer, and a base or/and a base precursor, wherein the light-sensitive material comprises a support and at least three image forming functional layers including a light-sensitive layer, a polymerizable layer and an image formation accelerating layer, said light-sensitive layer containing silver halide, said polymerizable layer containing the ethylenically unsaturated polymerizable compound or/and the cross-linkable polymer, and said image formation accelerating layer containing a component having a function of accelerating image formation which is selected from a reducing agent, a base, a base precursor and a heat development accelerator; and simultaneously or thereafter heating the light-sensitive material at a temperature in the range of 60° to 200° C. under conditions substantially not containing water to develop the silver halide and to imagewise harden the polymerizable compound so as to form a polymer image.

In the present specification, the term "conditions substantially not containing water" means that the content of water contained in the light-sensitive material is less than 10 weight % based on the total amount of the light-sensitive layer.

The present invention provides a light-sensitive material having a support and three or more image forming functional layers. Using the light-sensitive material of the invention, the following effects can be obtained.

1. In the light-sen material of the invention, the light-sensitive layer and the image formation accelerating layer are separated form the polymerizable layer. The components of the light-sensitive layer and the image formation accelerating layer such as silver halide, a base and a base precursor are not contained in the polymerizable layer. Therefore, the polymer image formed in the polymerizable layer has a high mechanical strength, since the polymerizable layer substantially consists of only the polymerizable compound or the cross-linkable polymer. Further, the formed polymer image is excellent in water-resistance. This effect is particularly advantageous in the case that the light-sensitive material is used as a presensitized printing plate.

On the other hand, a colored substance such as a dye or a pigment can be contained in the polymerizable layer to color the polymer image or to prevent halation (except that the colored substance is used as an antiirradiation agent which is preferably contained in the light-sensitive layer). The colored substance contained in the polymerizable layer does not influence the sensitivity of silver halide contained in the light-sensitive layer.

2 In the light-sensitive material of the invention, the image formation accelerating layer contains a component having a function of accelerating image formation selected from a reducing agent, a base, a base precursor and a heat development accelerator. Accordingly, at least one image formation accelerating component is separated from the light-sensitive layer and the polymerizable layer. According to study of the applicant, the preservability of the light-sensitive material is improved by the separation. Further, the applicant notes that the separated component in the image formation accelerating layer can be diffused into the other layers at a heat development process. Therefore, the separation of the image formation accelerating component does not affect the image forming reaction.

3. In the embodiment in which the polymerizable layer is provided between the support and the light-sensitive layer, the light-sensitive layer prevents oxygen from diffusing from the air to the polymerizable layer at the heat development process. The oxygen functions as a polymerization inhibitor. Therefore, the polymerization reaction smoothly proceeds in the light-sensitive material of the invention, since the function of the oxygen is inhibited by the light-sensitive layer.

Further, in the case that the light-sensitive material is heated while the surface of the light-sensitive material is open to the air, it is preferred that the uppermost layer (the image forming functional layer or a protective layer) contains a hydrophilic polymer binder which has a low transmission coefficient of oxygen of not more than $1.0 \times 10^{-11}$ cm$^3$·cm/cm$^2$·sec·cmHg.

4. The development process of the light-sensitive material comprises the developing reaction of silver halide and the hardening reaction of the polymerizable compound. In the light-sensitive material of the present invention, the two reactions separately proceed in the light-sensitive layer and the polymerizable layer. The two reactions smoothly proceed because the reactions do not affect each other.

A reaction of forming a base from a base precursor also proceeds at a development process. In the case that the base precursor is contained in the image formation accelerating layer, the three reactions separately and smoothly proceed in the three layers.

5. A base precursor is usually made of a base and a carboxylic acid. The carboxylic acid of the base precursor is decomposed to release the base by heat at a development process. The decomposed acid forms carbon dioxide. The applicant notes that bubbles of carbon dioxide decrease the quality of the obtained image.

In the case that the uppermost layer is the image formation accelerating layer containing the base precursor, carbon dioxide is rapidly released from the light-sensitive material. Accordingly, bubbles of carbon dioxide are not formed in this embodiment, and an image of high quality can be obtained.

6. In the case that a base precursor is contained in the light-sensitive layer, the particles of the base precursor tend to be precipitated in the coating solution of the light-sensitive layer. The applicant found that the precipitation is caused by the reaction of the base precursor with silver halide emulsion.

In the present invention, the problem of the precipitation can be solved by adding the base precursor into an image formation accelerating layer.

BRIEF DESCRIPTION OF THE DRAWINGS

FIGS. 2-A to 2-C are sectional views schematically illustrating embodiments of the light-sensitive material of the present invention having four or more layers.

FIGS. 3-A to 3-C are sectional views schematically illustrating the preferred order of the light-sensitive layer, the polymerizable layer and the image formation accelerating layer.

FIGS. 4-A to 4-F are sectional views schematically illustrating the preferred arrangement of the reducing agent and the base precursor (or base).

FIGS. 5-A to 5-F are sectional views schematically illustrating the preferred arrangement of the heat development accelerator.

FIG. 6-A, is a diagram showing the reaction at the step shown in FIG. 6.

FIG. 7-A is a diagram showing the reaction at the step shown in FIG. 7.

FIGS. 9-A to 9-C are sectional views schematically illustrating the light-sensitive materials disclosed in prior art.

DETAILED DESCRIPTION OF THE INVENTION

Figure 1:
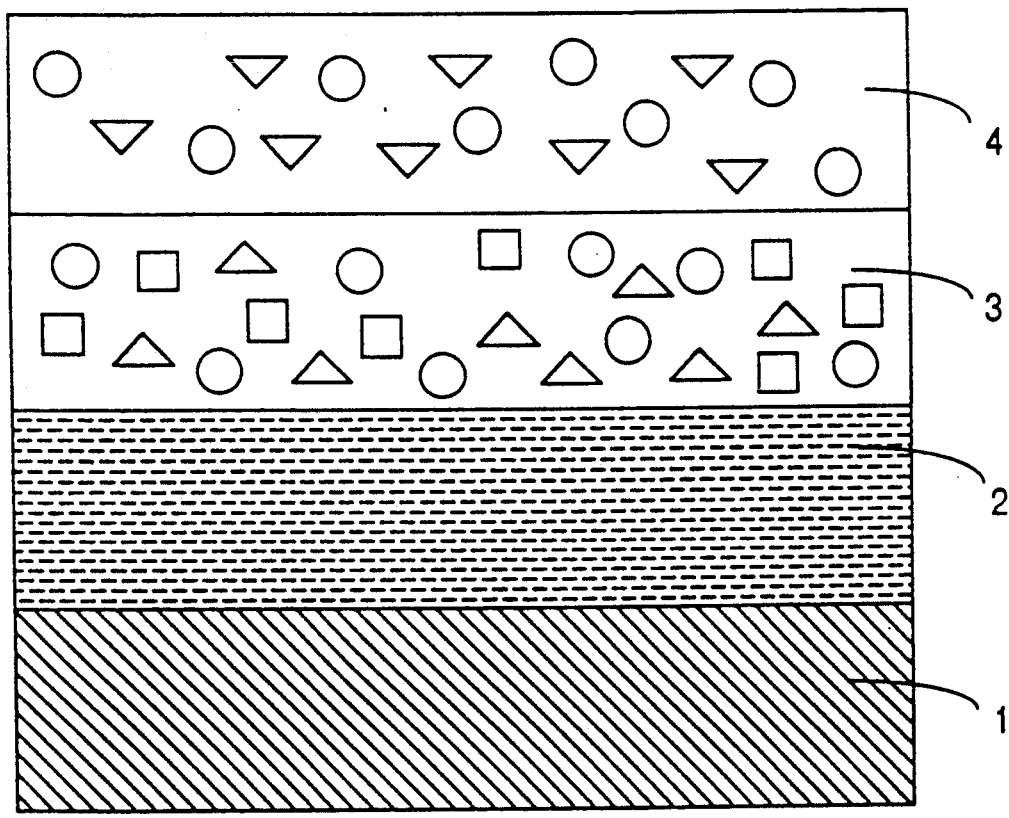
FIG. 1 is a sectional view schematically illustrating a preferred embodiment of the light-sensitive material of the present invention.

First preferred embodiments of the present invention are described below.

(1) The image formation accelerating layer preferably contains a base or base precursor. The image formation accelerating layer is provided to separate an image formation accelerating component from a light-sensitive layer and a polymerizable layer. It is preferred that the component to be separated is a base or base precursor.

A base precursor is preferred to a base for stability of the light-sensitive material. The base precursor preferably is a salt of an organic base with a carboxylic acid which releases the base when it is heated. The base precursor preferably releases a base at a temperature in the range of 50° to 200° C.

In the case that the image formation accelerating layer preferably contains the base or base precursor, the reducing agent can be contained in any of the image formation accelerating layer, the light-sensitive layer and the polymerizable layer.

(2) The light-sensitive material preferably contains a heat development accelerator. When the light-sensitive material is heated, it melts and accelerates melting or diffusion of reaction components. The accelerator further has a function of increasing the plasticity of a polymer (which functions as a binder) at a room temperature or at an elevated temperature in a heat development process. Thus, decomposition of the base precursor, diffusion of the formed base and the radical of the oxidized reducing agent, development of silver halide, polymerization of the polymerizable compound and cross-linking of the polymer are accelerated. The heat development accelerator may be contained in two or more layers.

(3) The reducing agent can be contained in any of the image formation accelerating layer, the light-sensitive layer and the polymerizable layer. However, if the image formation accelerating layer does not contain the other image formation accelerating components, namely a base, a base precursor and a heat development accelerator, the reducing agent should be contained in the image formation accelerating layer.

The reducing agent is preferably contained in the image formation accelerating layer or the light-sensitive layer in the case that the reducing agent has a function of inhibiting a polymerization (for example, when the reducing agent traps a radical) or in the case that the mechanical strength of the polymer image should be more improved.

(4) The polymerizable layer preferably contains an ethylenically unsaturated polymerizable compound.

(5) The polymerizable layer preferably contains a cross-linkable polymer. The polymer preferably has an ethylenically unsaturated group in its side chain.

(6) The polymerizable layer more preferably contains both of the ethylenically unsaturated polymerizable compound and a polymer. The polymer preferably is a cross-linkable polymer. In this case, the polymer also preferably has an ethylenically unsaturated group in its side chain.

(7) The polymerizable layer preferably contains a polymer binder having an acidic group in its molecule.

Using the acidic polymer binder, the unhardened polymerizable layer can be removed by an aqueous solution in place of an organic solvent after the heat development process. The aqueous solution (an etching solution) preferably is an alkaline solution.

The acidic polymer binder preferably is cross-linkable.

(8) The polymerizable layer most preferably contains both of the ethylenically unsaturated polymerizable compound and the cross-linkable polymer binder having an acidic group in its molecule. This embodiment is improved in the speed and rate of the polymerization reaction. Further, the unhardened polymerizable layer can be easily removed by an aqueous solution.

The polymer binder contained in the polymerizable layer preferably is not soluble in water contained in the coating solution of the light-sensitive layer. It is also preferred that the polymer binder has an affinity to an ink when the polymer image is used as a printing plate. Therefore, the polymer binder preferably is an oil soluble and is hydrophobic.

(9) The light-sensitive layer or the uppermost image formation accelerating layer preferably contains an hydrophilic polymer binder.

There is no specific limitation with respect to the hydrophilic polymer binder in the case that the light-sensitive material is heated while the surface of the light-sensitive material is shielded from the air. On the other hand, in the case that the light-sensitive material is heated while the surface of the light-sensitive material is open to the air, it is preferred that the hydrophilic polymer binder has a transmission coefficient of oxygen of not more than $1.0 \times 10^{-11} cm^3 \cdot cm/cm^2 \cdot sec \cdot cmHg$.

Further, the hydrophilic polymer binder preferably is soluble in water or swells in water.

In detail, the hydrophilic polymer binder preferably is gelatin or polyvinyl alcohol. Polyvinyl alcohol is more preferred. Polyvinyl alcohol preferably has a high saponification degree of not less than 70%, more preferably of not less than 80%, most preferably of not less than 95%. The hydrophilic polymer binder is preferably used in an amount in the range of 0.5 g to 10 $g/m^2$, and more preferably in the range of 1.0 g to 5 $g/m^2$. The molecular weight is preferably in the range of 3,000 to 500,000.

Using the polymer, the light-sensitive material can be heated while the surface of the light-sensitive material is open to the air. In the case of the surface of the light-sensitive material is open to the air, the quality of the obtained image is sometimes improved.

(10) A protective layer is preferably provided as the uppermost layer. In the case that the protective layer is provided, the above-mentioned hydrophilic polymer is preferably contained in the protective layer.

The hydrophilic polymer preferably has the above-mentioned low transmission coefficient of oxygen. Using the polymer, the light-sensitive material can be heated while the surface of the light-sensitive material is open to the air.

(11) A matting agent is preferably contained in the uppermost layer.

(12) A colored substance can be contained in the light-sensitive layer or the polymerizable layer.

The colored substance has a function of forming a visible polymer image. The colored substance further functions as an antihalation dye in the case that the absorption spectrum of the substance overlaps that of silver halide. The colored substance preferably does not influence silver halide (sensitivity and development thereof) and hardening reaction (polymerization and cross-linking).

(13) The light-sensitive layer can contain a colored substance as an antiirradiation dye.

The antiirradiation dye preferably does not influence silver halide (sensitivity and development thereof) and hardening reaction (polymerization and cross-linking).

(14) An antifogging agent is preferably contained in any of the layers.

(15) An organic silver salt is preferably contained in the light-sensitive material. The organic silver salt functions as an oxidizing agent, and is more preferably contained in the light-sensitive layer.

(16) A surface active agent can be contained in each of the layers.

(17) The support preferably is an aluminium sheet.

The aluminium sheet is preferably subjected to a surface treatment such as a surface-roughening treatment or an anodizing treatment.

(18) The silver halide is preferably contained in the light-sensitive layer in a coating amount of 1 mg to 5 g/m² in terms of silver. The reducing agent is preferably contained in an amount of 0.1 to 10 mole based on 1 mole of the silver halide. The polymerizable compound is preferably contained in the polymerizable layer in an amount of 3 to 90 weight % based on the amount of polymerizable layer.

The cross-linkable polymer is preferably contained in the polymerizable layer in an amount of 0.1 to 7 g/m². The base or/and the base precursor is preferably contained in the image formation accelerating layer in an amount of 0.5 to 50 mole based on 1 mole of the silver halide.

(19) The polymerizable layer preferably has a thickness in the range of 0.3 to 7 μm. The light-sensitive layer preferably has a thickness in the range of 0.5 to 20 μm. The image formation accelerating layer preferably has a thickness in the range of 0.3 to 20 μm. The protective layer preferably has a thickness in the range of 0.5 to 20 μm.

(20) In the image forming method, it is preferred that the oxidation product of the reducing agent is formed by the development of the silver halide, the oxidation product or a radical formed from the product is transferred from the light-sensitive layer to the polymerizable layer, and the polymerizable compound is imagewise hardened by the function of the oxidation product or the radical.

(21) The light-sensitive material can be heated while the surface of the light-sensitive material is shielded from the air. In the case that the hydrophilic polymer having the low transmission coefficient of oxygen is not used in the uppermost layer, this process is preferred.

(22) The light-sensitive material can also be heated while the surface of the light-sensitive material is open to the air. In the case that the hydrophilic polymer having the low transmission coefficient of oxygen is used in the uppermost layer, this process is preferred, since the occurrence of the fog or stain is reduced in the formed polymer image, and the latitude of the development conditions is broad in this process.

(23) After the polymer image is formed (namely after the heat-development process), the light-sensitive material is preferably washed out with an aqueous etching solution (preferably alkaline solution) to remove the unhardened polymerizable layer.

(24) After the polymer image is formed, the light-sensitive material can be washed out with water or an aqueous solution to remove the layers other than the polymerizable layer, and then washed out with an etching solution to remove the unhardened polymerizable layer.

(25) After the polymer image is formed, the light-sensitive material can be washed out with an etching solution to remove the layers other than the polymerizable layer and the unhardened polymerizable layer.

Next, the light-sensitive material and the image forming method of the invention will be described in more detail hereinafter referring to the drawings.

FIG. 1 is a sectional view schematically illustrating the most preferred embodiment of the light-sensitive material of the present invention.

As is shown in FIG. 1, on a support (1), a polymerizable layer (2) is provided. On the polymerizable layer (2), a light-sensitive layer (3) is provided. On the light-sensitive layer (3), an image formation accelerating layer (4) is provided.

The polymerizable layer (2) contains an ethylenically unsaturated polymerizable compound.

The light-sensitive layer (3) contains silver halide (□), a reducing agent (Δ) and a heat development accelerator (◯).

The image formation accelerating layer (4) contains a base precursor (∇) and a heat development accelerator (◯).

FIGS. 2-A to 2-C are sectional views schematically illustrating embodiments of the light-sensitive material of the present invention having four or more layers.

The light-sensitive material shown in FIG. 2-A is an example of the embodiment having four image forming functional layers. As is shown in FIG. 2-A, on a support (11), a polymerizable layer (12) containing an ethylenically unsaturated polymerizable compound is provided. On the polymerizable layer (12), a first image formation accelerating layer (13) containing a reducing agent (Δ) is provided. On the first image formation layer (13), a light-sensitive layer (14) containing silver halide (□) and a heat development accelerator (◯) is provided. On the light-sensitive layer (14), a second image formation layer (15) containing a base precursor (∇) is provided.

The light-sensitive material shown in FIG. 2-B is an example of the embodiment having five image forming functional layers. As is shown in FIG. 2-B, on a support (21), a polymerizable layer (22) containing an ethylenically unsaturated polymerizable compound is provided. On the polymerizable layer (22), a first image formation accelerating layer (23) containing a reducing agent (Δ) is provided. On the first image formation layer (23), a light-sensitive layer (24) containing silver halide (□) is provided. On the light-sensitive layer (24), a second image formation accelerating layer (25) containing a heat development accelerator (◯) is provided. On the second image formation accelerating layer (25), a third image formation layer (26) containing a base precursor (∇) is provided.

The light-sensitive material shown in FIG. 2-C is an example of the embodiment having image forming functional layers and non-functional layers. As is shown in FIG. 2-C, on a support (31), an undercoating layer (32) is provided. On the undercoating layer (32), a polymerizable layer (33) containing an ethylenically unsaturated polymerizable compound is provided. On the polymerizable layer (33), a first intermediate layer (34) is provided. On the first intermediate layer (34), a light-sensitive layer (35) containing silver halide (□), a reducing agent (Δ) and a heat development accelerator (◯) is provided. On the light-sensitive layer (35), a second intermediate layer (36) is provided. On the second intermediate layer (36), an image formation accelerating layer (37) containing a base precursor (∇) and a heat development accelerator (◯) is provided. On the image formation accelerating layer (37), a protective layer (38) is provided.

FIGS. 3-A to 3-C are sectional views schematically illustrating the preferred order of the light-sensitive layer, the polymerizable layer and the image formation accelerating layer.

It is preferred that the polymerizable layer is arranged between the support and the light-sensitive layer, since otherwise the polymerizable layer may affect the sensitivity of the light-sensitive layer by optical absorption. Accordingly, in the case that the light-sensitive material has three image forming functional layers (namely, one light-sensitive layer, one polymerizable layer and one image formation accelerating layer), there are three preferred embodiments shown in FIGS. 3-A to 3-C with respect to the order of the layers.

The embodiment shown in FIG. 3-A comprises a support (41), a polymerizable layer (42), a light-sensitive layer (43) and an image formation accelerating layer (44) in the order. The embodiment shown in FIG. 3-B comprises a support (51), a polymerizable layer (52), an image formation accelerating layer (53) and a light-sensitive layer (54) in the order. The embodiment shown in FIG. 3-C comprises a support (61), an image formation accelerating layer (62), a polymerizable layer (63) and a light-sensitive layer (64) in the order. The embodiment shown in FIG. 3-A is particularly preferred.

FIGS. 4-A to 4-F are sectional views schematically illustrating the preferred arrangement of the reducing agent and the base precursor (or base). The order of the layers shown in FIGS. 4-A to 4-F is the most preferred embodiment (shown in FIG. 3-A). Namely, each of the embodiments shown in FIGS. 4-A to 4-F comprises a support, a polymerizable layer, a light-sensitive layer containing silver halide (□) and an image formation accelerating layer in the order.

FIG. 4-A shows a light-sensitive material which does not contain image formation accelerating components other than the reducing agent (i.e., a base, a base precursor and a heat development accelerator). As is shown in FIG. 4-A, the reducing agent (Δ) should be contained in the image formation accelerating layer.

FIGS. 4-B to 4-F show various embodiments of a light-sensitive material containing a reducing agent and a base precursor.

In the embodiment shown in FIG. 4-B, the reducing agent (Δ) and the base precursor (∇) are contained in the image formation accelerating layer.

In the embodiment shown in FIG. 4-C, the reducing agent (Δ) is contained in the image formation accelerating layer, and the base precursor (∇) is contained in the light-sensitive layer.

In the embodiment shown in FIG. 4-D, the reducing agent (Δ) is contained in the image formation accelerating layer, and the base precursor (∇) is contained in the polymerizable layer.

In the embodiment shown in FIG. 4-E, the base precursor (∇) is contained in the image formation accelerating layer, and the reducing agent (Δ) is contained in the light-sensitive layer.

In the embodiment shown in FIG. 4-F, the base precursor (∇) is contained in the image formation accelerating layer, and the reducing agent (Δ) is contained in the polymerizable layer.

The base precursor (∇) is preferably contained in the image formation accelerating layer. Accordingly, the embodiments shown in FIGS. 4-B, 4-E and 4-F are particularly preferred.

FIGS. 5-A to 5-F are sectional views schematically illustrating the preferred arrangement of the heat development accelerator. The order of the layers and the arrangement of the reducing agent and base precursor shown in FIGS. 5-A to 5-F is the preferred embodiment (shown in FIG. 4-E). Namely, each of the embodiments shown in FIGS. 5-A to 5-F comprises a support, a polymerizable layer, a light-sensitive layer containing silver halide (□) and a reducing agent (Δ) and an image formation accelerating layer containing a base precursor (∇) in the order.

In the embodiment shown in FIG. 5-A, the heat development accelerator (○) is contained in the image formation accelerating layer.

In the embodiment shown in FIG. 5-B, the heat development accelerator (○) is contained in the light-sensitive layer.

In the embodiment shown in FIG. 5-C, the heat development accelerator (○) is contained in the polymerizable layer.

In the embodiment shown in FIG. 5-D, the heat development accelerator (○) is contained in the image formation accelerating layer and the light-sensitive layer.

In the embodiment shown in FIG. 5-E, the heat development accelerator (○) is contained in the image formation accelerating layer and the polymerizable layer.

In the embodiment shown in FIG. 5-F, the heat development accelerator (○) is contained in the light-sensitive layer and the polymerizable layer.

The heat development accelerator (○) is preferably contained in the image formation accelerating layer or the light-sensitive layer. Accordingly, the embodiments shown in FIGS. 5-A, 5-B and 5-D are particularly preferred. The embodiment shown in FIG. 5-D corresponds to the light-sensitive material shown in FIG. 1.

Figure 6:
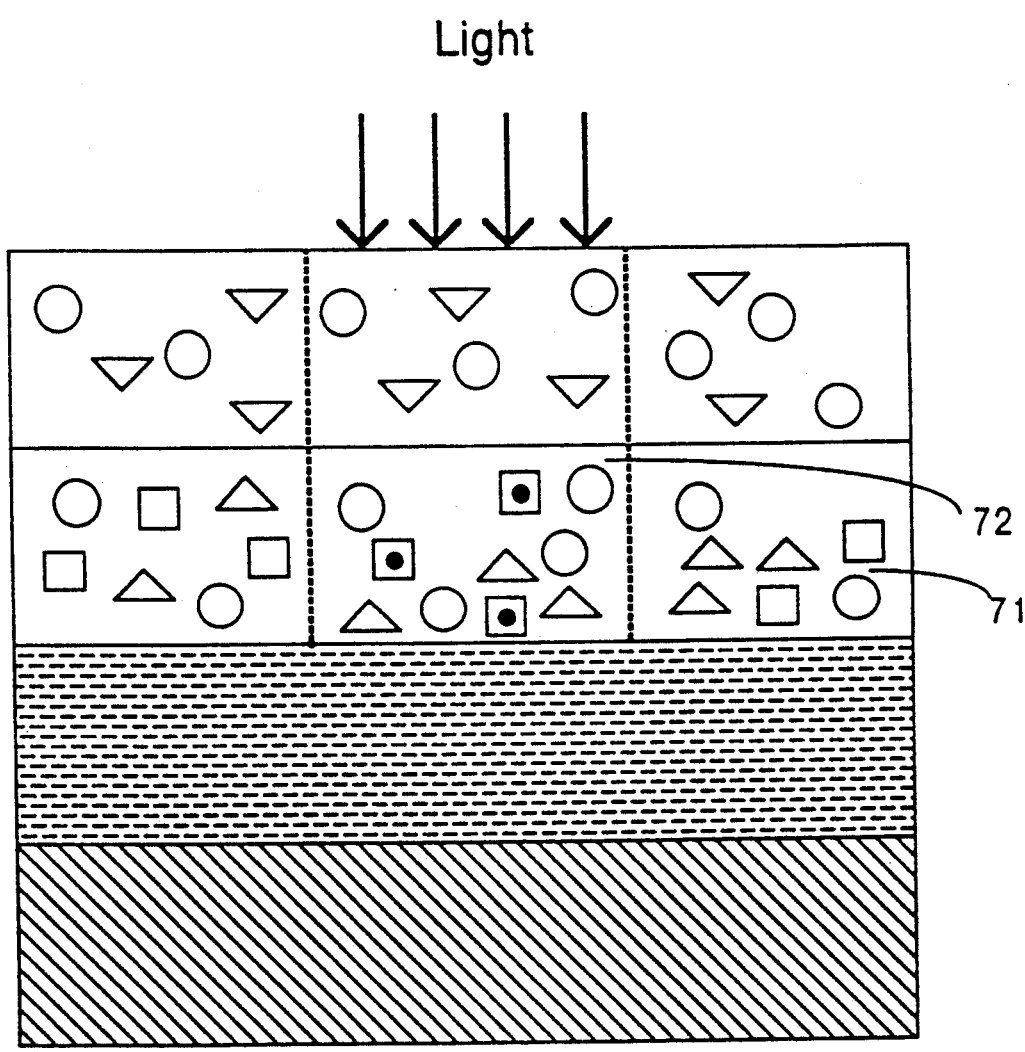
FIG. 6 is a sectional view schematically illustrating the step of imagewise exposing to light the light-sensitive material.

FIG. 6 is a sectional view schematically illustrating the step of imagewise exposing to light the light-sensitive material. FIG. 6-A is a diagram showing the reaction at the step shown in FIG. 6.

As is shown in FIG. 6 and FIG. 6-A, the latent image of the silver halide (■) is formed within the exposed area (72). On the other hand, the silver halide (□) within the unexposed area (71) is not changed.

Figure 7:
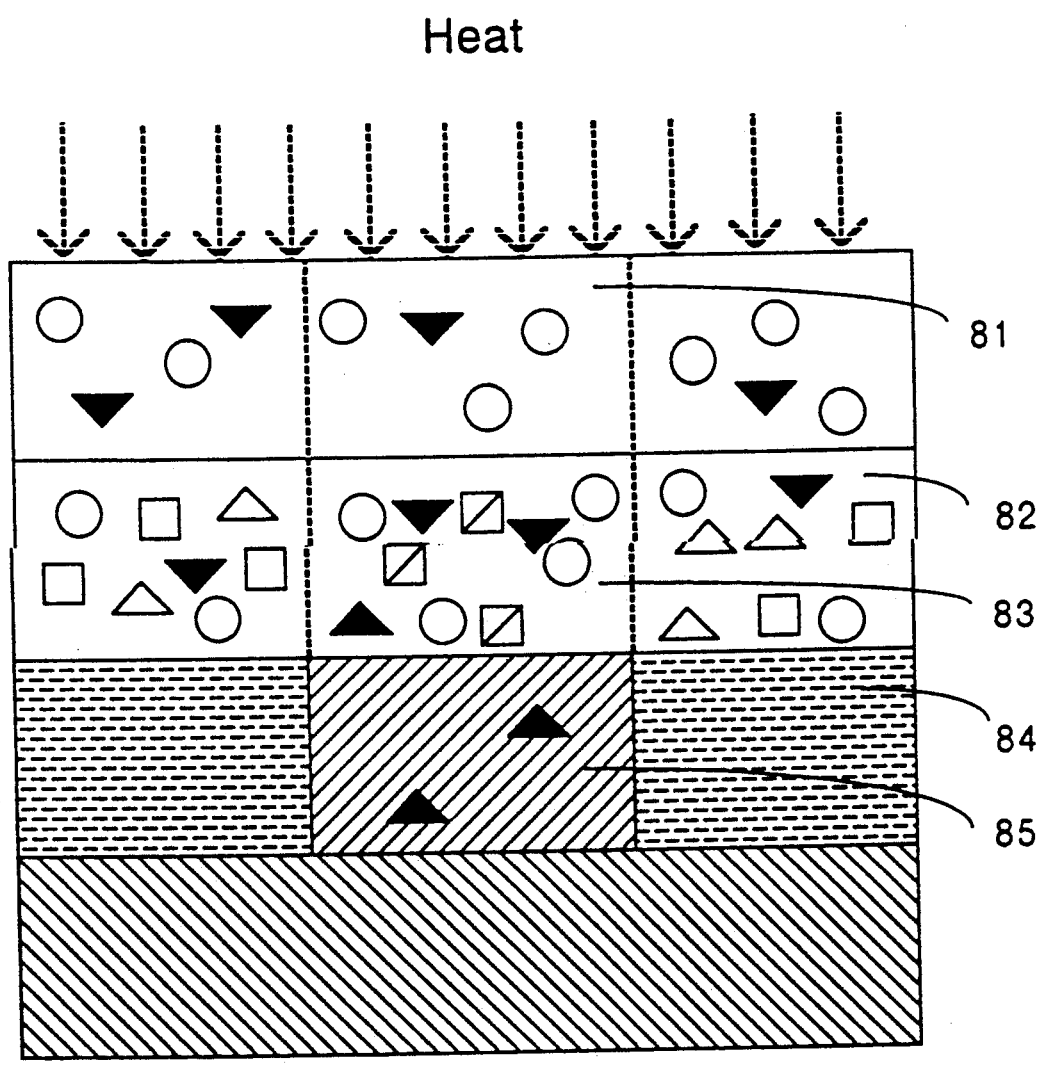
FIG. 7 is a sectional view schematically illustrating the step of heating the light-sensitive material.

FIG. 7 is a sectional view schematically illustrating the step of heating the light-sensitive material. FIG. 7-A is a diagram showing the reaction (development reaction) at the step shown in FIG. 7.

As is shown in FIG. 7 and FIG. 7-A, the following three reactions (a), (b) and (c) simultaneously proceed when the light-sensitive material is heated.

(a) When the base precursor (∇) is heated, the precursor releases a base (▼) in the image formation accelerating layer (81). The formed base is diffused (transferred) by heat and by the function of the heat development accelerator (○) from the image formation accelerating layer (81) to the light-sensitive layer (82 and 83). Thus the internal condition of the light-sensitive layer is changed to an alkaline condition.

(b) The reducing agent (Δ) develops the latent image of silver halide (■) in the exposed area of the light-sensitive layer (83) Thus the silver image (▨) and a radical of the oxidized reducing agent (▲) are formed. The radical of the oxidized reducing agent (▲) is diffused (transferred) by heat and by the function of the heat development accelerator (○) to the exposed area of the polymerizable layer (85).

(c) The radical initiates hardening of the polymerizable compound in the exposed area of the polymerizable layer (85). On the other hand, the polymerizable compound is not hardened in the unexposed area of the polymerizable layer (84).

As is described above, a polymer image having a high mechanical strength is formed in the exposed area of the polymerizable layer (85). The formed polymer can be used in various processes. An example is shown in FIG. 8.

Figure 8:
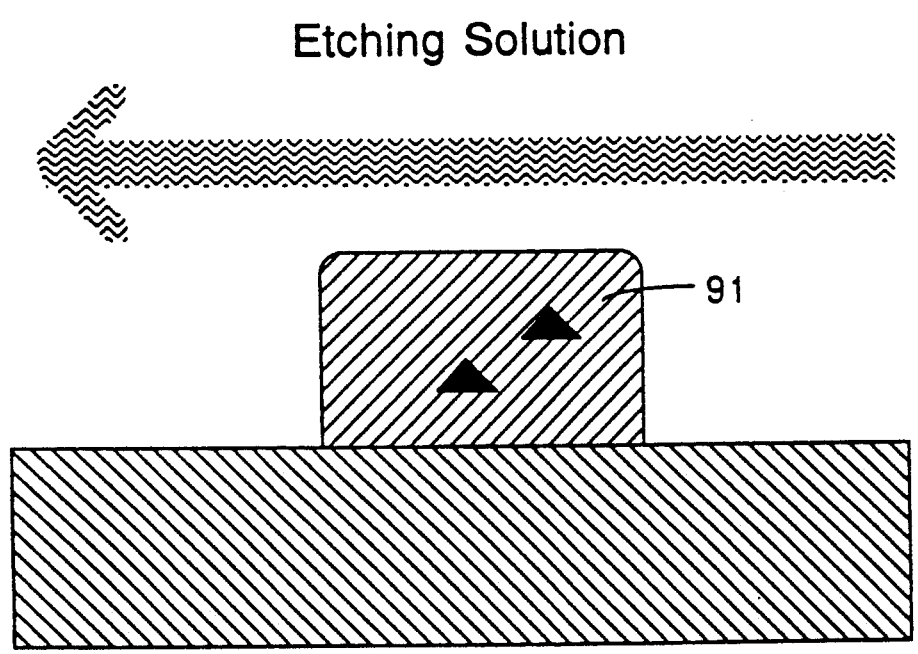
FIG. 8 is a sectional view schematically illustrating the step of washing the light-sensitive material with an etching solution.

FIG. 8 is a sectional view schematically illustrating the step of washing the light-sensitive material with an etching solution.

As is shown in FIG. 8, all of the image formation accelerating layer, all of the light-sensitive layer and the unexposed (unhardened) area of the polymerizable layer are removed by the etching solution. The polymer image formed in the exposed area of the polymerizable layer thus remains. This polymer image can be advantageously used as a printing plate.

The support and the layers of the light-sensitive material are described below in more detail.

Support

Examples of the support materials employable in the invention include ordinary papers, synthetic papers, synthetic resin-laminated papers (e.g., polyethylene, polypropylene or polystyrene laminated paper), plastic films (e.g., films of polyethylene terephthalate, polycarbonate, polyimide, nylon and cellulose triacetate), metallic sheets (e.g., sheets of aluminium, aluminium alloy, zinc, iron and copper), and papers or plastic films laminated or deposited with those metals.

In the case of using the light-sensitive material as a presensitized lithographic printing plate, the aluminium sheet, polyethylene terephthalate film, polycarbonate film, ordinary papers and the synthetic papers are preferably employed as the support material. Also preferred is a complex sheet in which an aluminium sheet is provided on a polyethylene film, as is described in Japanese Patent Publication No. 48(1973)-18327. A paper support is described in Japanese Patent Provisional Publications No. 61(1986)-3797 and No. 61(1986)-112150.

An aluminium sheet is particularly preferred. The aluminium is described below in more detail.

If necessary, the support may be subjected to a surface treatment such as a surface-roughening treatment or a treatment for making the surface hydrophilic.

Examples of methods for the surface treatment (graining treatment) include an electrochemical graining method wherein an aluminium sheet is grained in a hydrochloric acid or nitric acid electrolytic solution by applying an electric current thereto; and mechanical graining methods such as a wire brush grain method wherein the surface of an aluminium sheet is grained with a metallic wire, a ball grain method wherein the surface of an aluminium sheet is grained with an abrasive ball and an abrasive, and a brush grain method wherein the surface of an aluminium sheet is grained with a nylon brush and an abrasive. These methods can be used singly or in combination.

The grained aluminium sheet is then subjected to a chemical etching with an acid or an alkali. Industrially advantageous is an etching with alkali. Examples of the alkaline agents used therefor include sodium carbonate, sodium aluminate, sodium metasilicate, sodium phosphate, sodium hydroxide, potassium hydroxide and lithium hydroxide. The etching with an alkaline agent is preferably carried out under such conditions that the concentration of the alkaline agent in an alkaline solution is in the range of 1 to 50% by weight, the temperature of the alkaline solution is in the range of 20° to 100° C., and the amount of the aluminium sheet to be dissolved is in the range of 5 to 20 g/m$^2$.

After the alkali etching is complete, pickling is generally carried out to remove smuts left behind on the surface of the aluminium sheet. Preferred examples of acids used in the pickling include a nitric acid, a sulfuric acid, phosphoric acid, a chromic acid, a hydrofluoric acid and a borofluoric acid.

After the electrochemical surface-roughening treatment, a smut-removing treatment is generally performed. This smut-removing treatment can be effected by a method of bringing the aluminium sheet into contact with 15 to 65 weight % sulfuric acid solution at 50° to 60° C., as is described in Japanese Patent Publication No. 53(1978)-12739 or a method described in Japanese Patent Publication No. 48(1973)-28123.

The aluminium support having been roughened on the surface as described above may be then subjected to an anodizing treatment or a chemical treatment, if desired.

The anodizing treatment can be made by any of conventional methods. For example, a direct current or an alternating current is applied to the aluminium support in a solution of sulfuric acid, phosphoric acid, chromic acid, oxalic acid, sulfamic acid or benzenesulfonic acid, singly or in combination, to form an anodized film on the surface of the aluminium support. The conditions for the anodizing treatment varies depending on the electrolytic solution to be used, but generally, it is preferred that the concentration of the electrolytic solution is in the range of 1 to 80 weight.%, the temperature thereof is in the range of 5° to 70° C., a current density is in the range of 0.5 to 60 A/dm$^2$, a voltage is in the range of 1 to 100 V, and the time for the treatment is in the range of 10 to 100 seconds.

Particularly preferred processes for the anodizing treatment are a process of anodizing the aluminium sheet in a sulfuric acid at a high current density as described in U.K. Patent No. 1,412,768 and a process of anodizing the aluminium sheet using a phosphoric acid as an electrolytic bath as described in U.S. Pat. No. 3,511,661.

The aluminium sheet having been subjected to the anodizing treatment may be further subjected to an alkali metal silicate treatment (e.g., a method of immersing the aluminium sheet in an aqueous solution of sodium silicate) as described in U.S. Pat. Nos. 2,714,066 and 3,181,461. Alternatively, the aluminium sheet may be provided with an undercoat layer made of hydrophilic cellulose (e.g., carboxymethyl cellulose) containing a water-soluble metallic salt (e.g., zinc acetate) as described in U.S. Pat. No. 3,860,426.

An undercoating layer can be provided between the support and the layers. The undercoating layer has a function of improving the printing property and the adhesiveness of the layers such as the polymerizable layer to the support (aluminium sheet).

Undercoating Layer

Examples of the components of the undercoating layer include casein, polyvinyl alcohol, ethyl cellulose, phenol resin, styrene-maleic anhydride resin, polyacrylic acid, monoethanolamine, diethanolamine, triethanolamine, tripropanolamine, chloride thereof, oxalate thereof, phosphate thereof, a monoaminomonocarboxylic acid such as aminoacetic acid and alanine, a hydroxyaminoacid such as serine, threonine and dihydroxyethylglycine, a sulfur-containing amino acid such as cystein and cystine, a monoaminodicarboxylic acid such as aspartic acid and glutamic acid, a diaminomonocarboxylic acid such as lysine, an aromatic amino acid such as p-hydroxyphenylgrycine, phenylalanine and anthranilic acid, a heterocyclic amino acid such as tryptophan and proline, an aliphatic aminosulfonic acid such as sulfamic acid and cyclohexylsulfamic acid, a (poly)aminopolyacetic acid such as ethylenediaminetetraacetic acid, nitrilotriacetic acid, iminodiacetic acid, hydroxyethylethylenediaminetriacetic acid, ethylenediaminediacetic acid, cyclohexanediaminetetraacetic acid, diethylenetriaminepentaacetic acid and glycoletherdiaminetetraacetic acid, and a partial or whole sodium, potassium or ammonium salt thereof. These components can be used singly or in combination.

Polymerizable Layer

The polymerizable layer can be hardened by a radical or another initiator. Examples of the hardening reaction include:

(1) a polymerization reaction of the polymerizable compound;

(2) a cross-linking (addition) reaction wherein an intermediate radical formed at the stage of the polymerization reaction of the polymerizable compound is added to a functional group (for example ethylenically unsaturated group) of the polymer;

(3) a graft reaction wherein a polymer radical, which is formed by removing an atom (for example hydrogen and a halogen atom) from a polymer by an intermediate radical or a polymerization initiator radical, or is formed by adding a radical to a functional group of the polymer, is added to the polymerizable compound to cause a polymerization; and (4) a cross-linking reaction of the polymer radicals.

The polymerizable layer can be prepared by the process comprising the steps of dissolving or dispersing a polymerizable compound, a binder polymer having or not having an acidic group (and another binder polymer which is an optional component) and a coloring matter in an appropriate organic solvent to prepare a coating solution (or dispersion) for formation of a polymerizable layer, coating the solution (or dispersion) on the aforementioned support, and drying the coated layer.

The components of the polymerizable layer are described later.

The thickness of the polymerizable layer is preferably in the range of 0.3 to 7 $\mu$m, more preferably 0.5 to 3 $\mu$m. If the thickness thereof is less than 0.3 $\mu$m, the plate wear of the resulting printing plate is lowered because the polymer image forming layer is too thin. If the thickness thereof exceeds 7 $\mu$m, the polymerizable layer is not hardened thoroughly up to the bottom surface. The amount of the polymerizable compound or the binder polymer to be contained in the polymerizable layer can be calculated by the above-mentioned ratio and the thickness of the polymerizable layer. The amount of the polymerizable compound is preferably in the range of 0.03 to 2 g/m$^2$, more preferably 0.1 to 0.7 g/m$^2$. The whole amount of the binder polymer is preferably in the range of 0.1 to 7 g/m$^2$, more preferably 0.3 to 3 g/m$^2$.

Light-Sensitive Layer

The light-sensitive layer can be formed by dispersing or dissolving components such as silver halide and other optional components in water to prepare a coating solution (or dispersion), coating and drying the solution (or the dispersion). Some of components are initially dissolved in an appropriate solvent, and then the obtained solution is added to water.

The light-sensitive material can also be formed by forming a polymerizable layer on a support, forming a light-sensitive layer on another support, superposing the light-sensitive layer on the polymerizable layer, and removing one of the two supports.

The components of the light-sensitive layer are described later.

The thickness of the light-sensitive layer is preferably in the range of 0.5 to 20 $\mu$m, more preferably 1 to 5 $\mu$m.

Image Formation Accelerating Layer

The image formation accelerating layer can also be formed by dispersing or dissolving components, coating the solution (or the dispersion), and drying the coated layer.

The components of the image formation accelerating layer are described later.

The thickness of the image formation accelerating layer is preferably in the range of 0.3 to 20 $\mu$m, more preferably 1 to 10 $\mu$m.

Protective Layer

A protective layer may be provided as the uppermost layer. The protective functions as an oxygen-shielding layer. Further, it is preferred that the protective layer is preferably composed of a hydrophilic substances for an etching process. Accordingly, the protective layer preferably contains a water-soluble binder polymer (e.g., polyvinyl alcohol).

A preferred water-soluble binder is polyvinyl alcohol having a high saponification degree of not less than 70%, more preferably of not less than 80%, most preferably of not less than 95%. The water-soluble binder is described later in more detail.

The thickness of the protective layer is preferably in the range of about 1 to 10 $\mu$m. The amount of the components contained in the protective layer is preferably in the range of 0.5 to 10. g/m$^2$, and more preferably in the range of 1.0 to 5 g/m$^2$.

The protective layer may also be composed of a water-insoluble polymer. The water-insoluble polymer is available in the form of a solution in an organic solvent or a latex. When the water-insoluble polymer is used, the protective layer should be removed from the light-sensitive material prior to an etching process by pealing apart or by dissolving the layer in a solvent.

A matting agent can be contained in the uppermost layer such as the protective layer. The matting agent has a function of decreasing the adhesiveness of the topmost layer. The matting agent preferably is powder of a polymer. The polymer is a natural polymer such as starch or is a synthetic polymer such as polyethylene. The particle size of the powder is preferably in the range of 1 to 50 $\mu$m.

Intermediate Layer

An intermediate layer can be provided between the above-mentioned layers.

The intermediate layer may function as an anti-halation layer, which contains a colored substance. Further, the intermediated layer may have a function of preventing components from diffusion to other layers before use of the light-sensitive material. There is no specific limitation with respect to the components of the intermediate layer. The thickness of the intermediate layer is preferably not more than 10 μm.

The components having a function of forming an image contained in the light-sensitive layer, the polymerizable layer and the image formation accelerating layer are described below. The arrangement of the components has been described referring to the drawings.

Polymerizable Compound

The polymerizable compound contained in the polymerizable layer has an ethylenic unsaturated group.

Examples of the compounds having an ethylenic unsaturated group include acrylic acids, salts of acrylic acids, acrylic esters, acrylamides, methacrylic acids, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

As the compound having an ethylenic unsaturated group, acrylic esters or methacrylic esters are preferred.

Concrete examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyloxy acrylate, nonylphenyloxyethyl acrylate, 1,3-dioxolane acrylate, hexanediol diacrylate, butanediol diacrylate, neopentyl glycol diacrylate, trimethylolpropane triacrylate, tricyclodecanedimethylol diacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxanediacrylate, 2-(2-hydroxy-1,1-dimethylethyl)-5,5-dihydroxymethyl-1,3-dioxanetriacrylate, triacrylate of propylene oxide addition product of trimethylolpropane, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentyl glycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compound can be selected from commercially available ones, such as Aronix M-309, M-310, M-315, M-400, M-6100, M-8030, M-8100 (trade names, all available from Toa Gosei Kagaku Kogyo Co., Ltd.) and Kayarad HX-220, HX-620, R-551, TMPTA, D-330, DPHA, DPCA-60, R604, R684 (trade names, all available from Nippon Kayaku Co., Ltd.).

The polymerizable compounds can be used singly or in combination of two or more compounds. Further, a compound formed by bonding a polymerizable functional group such as a vinyl group or a vinylidene group to chemical structure of a reducing agent or a colored substance is also employed as the polymerizable compound. A light-sensitive material using a compound which serves as both a reducing agent and a polymerizable compound or both a colored substance and a polymerizable compound can be also included in embodiments of the light-sensitive material.

The amount of the polymerizable compound contained in the polymerizable layer is preferably in the range of 3 to 90% by weight, more preferably in the range of 15 to 60% by weight, based on the whole amount of the polymerizable layer.

Binder Polymer (Cross-Linkable Polymer)

The cross-linkable polymer used in the present invention is (A) a polymer which has a double bond in its side chain or main chain or (B) a polymer which forms a polymer radical by reaction with another radical.

To the double bond of the polymer (A), an intermediate radical formed at the stage of the polymerization reaction of the polymerizable compound or a polymerization initiator radical can be added. Examples of the polymer (A) include a polymer having a double bond in its side chain such as a polymer (includes copolymer) of allyl(meth)acrylate, 1,2-polybutadiene and 1,2-polyisoprene; and a polymer having a double bond in its main chain such as poly-1,4-butadiene, poly-1,4-isoprene (includes copolymer) and a natural or synthetic-rubber.

The polymer radical is formed by removing an atom (for example hydrogen and a halogen atom such as chlorine) from the polymer (B) by an intermediate radical or a polymerization initiator radical. Examples of the polymer (B) include a polymer having active hydrogen such as polymers (include copolymers) of vinyl chloride, vinylidene chloride, vinyl acetate, acrylonitrile, styrene and (meth)acrylate, chlorinated polyethylene, polyvinyl formal, polyvinyl butyral, methyl cellulose, ethyl cellulose and butyl cellulose.

The cross-linkable polymer is described at pages 147 to 192 in "Polymer Reaction" (edited by Polymer Society in Japan, Kyoritsu Shuppan, 1978).

As the binder polymer to be contained in the polymerizable layer, two or more kinds of polymers can be employed, but at least one of those polymers preferably has an acidic group in the molecule. Other binder polymers may have or may not have the acidic group. The binder polymer having an acidic group preferably is a homopolymer of a vinyl monomer having an acidic group or a copolymer of the homopolymer and a vinyl monomer not having an acidic group. Examples of the vinyl monomers having an acidic group include acrylic acid, methacrylic acid, styrenesulfonic acid and maleic anhydride. The monomers which are copolymerized with the monomers having an acidic group can be selected from vinyl monomers having copolymerizability. Examples of the monomers include (meth)acrylates such as methyl (meth)acrylate, ethyl (meth)acrylate, butyl (meth)acrylate, hydroxyethyl (meth)acrylate, benzyl (meth)acrylate, polyethylene glycol mono(meth)acrylate, allyl (meth)acrylate and vinyl (meth)acrylate; vinyl acetate; styrene; (meth)acrylonitrile; vinyl chloride; and vinylidene chloride. Particularly preferred are monomers having a vinyl group and an ethylenically unsaturated double bond, such as allyl (meth)acrylate.

The molar content of the monomer having an acidic group in the copolymer is generally in the range of 1% to 50%, and more preferably in the range of 5% to 30%.

The binder polymer having an acidic group may be a homopolymer or a copolymer synthesized from a monomer not having an acidic group into which an acidic group such as a carboxyl group or a sulfone group is introduced.

As the binder polymer for the polymerizable layer, a combination of the above-mentioned polymer having an acidic group and other binder polymer not having an acidic group can be also employed. The binder polymer not having an acidic group which can be used in combination with the polymer having an acidic group can be selected from various polymers. In concrete, there can be mentioned poly(meth)acrylate, polyvinyl butyral, polyvinyl formal, polyvinyl pyrrolidone, polyvinyl acetate, vinyl acetate-ethylene copolymer, polyvinyl chloride, polyvinylidene chloride, vinyl chloride-vinylidene chloride copolymer, vinylidene chloride-acrylonitrile copolymer, chlorinated polyethylene, chlorinated polypropylene, polycarbonate, diacetyl cellulose, cellulose acetate butyrate, triacetyl cellulose, ethyl cellulose, polyvinyl pyridine and polyvinyl imidazole. Of these polymers, particularly preferred is a polymer or a copolymer of monomers having a vinyl group and further an ethylenically unsaturated double bond, such as allyl (meth)acrylate. The reason is assumably that the polymerizable compound is reacted with the double bond of the binder polymer in the polymerization procedure to be rapidly hardened so as to form a polymer image of high strength.

The molecular weight of the binder polymer is preferably in the range of about 3,000 to 500,000.

The amount of the binder polymer having an acidic group is preferably in the range of 10 to 100% by weight, more preferably 50 to 100% by weight, based on the whole amount of the binder polymer(s) contained in the polymerizable layer. In the case of using a binder polymer having an ethylenically unsaturated double bond on the side chain and further having an acidic group in combination, the amount of the binder polymer is preferably in the range of weight, based on the whole amount of the binder polymer(s) 10 to 100% by weight, more preferably 50 to 100% by contained in the polymerizable layer. In the case of using a binder polymer having an ethylenically unsaturated double bond on the side chain but not having an acidic group in combination, the amount of the binder polymer preferably is in the range of 10 to 95% by weight, more preferably 50 to 90% by weight, based on the whole amount of the binder polymer(s) contained in the polymerizable layer.

In the case that the binder polymer has an ethylenically unsaturated group in its side chain, a polymer image can be formed without using the polymerizable compound. On the other hand, a polymer image can be formed using the polymerizable compound only. However, it is preferred to use both of the binder polymer and the polymerizable compound to form a hard polymer image.

Colored Substance

The layers of the light-sensitive material such as the polymerizable layer may be colored by a colored substance.

There is no specific limitation on the colored substance (i.e., coloring matter), and any known pigments and dyes can be employed. The coloring matter also serves as an anti-halation agent, so that it is preferably contained in the polymerizable layer. The coloring matter can also be contained in the light-sensitive layer for the purpose of anti-irradiation.

The pigments employable in the invention can be selected from those commercially available and those described in various publications such as "Handbook of Color Index", "New Handbook of Pigments", (Nippon Ganryo Gijutsu Kyokai (ed.,), 1977), "New Applied Technique of Pigments", (CMC Publishing, 1986), and "Technique of Printing Ink", (CMC Publishing, 1984).

Examples of the pigments include black pigments, yellow pigments, orange pigments, brown pigments, red pigments, violet pigments, blue pigments, green pigments, fluorescent pigments, metal powder pigments and polymer pigments. Concrete examples of the pigments include insoluble azo pigments, azo lake pigments, condensation azo pigments, chelate azo pigments, phthalocyanine pigments, anthraquinone pigments, perylene pigments, perynone pigments, thioindigo pigments, quinacridone pigments, dioxazine pigments, isoindolinone pigments, quinophthalone pigments, dye-type lake pigments, azine pigments, nitroso pigments, nitro pigments, natural pigments, fluorescent pigments and inorganic pigments.

The pigment employable in the invention can be per se used or can be used after being subjected to surface treatment. As the surface treatment, there can be employed a method of coating a resin or wax on the surface of the pigment, a method of depositing a surface active agent thereon, a method of bonding a reactive substance (e.g., silane coupling agent, epoxy compound and polyisocyanate) to the surface of the pigment. Those methods are described, for example, in "Nature and Application of Metal Soap", (Saiwai Shobo), "Technique of Printing Ink", (CMC Publishing, 1984), and "New Applied Technique of Pigments", (CMC Publishing, 1986).

The particle diameter of the pigment is preferably in the range of 0.01 to 10 $\mu$m, more preferably 0.05 to 1 $\mu$m.

The pigment can be introduced into the polymerizable layer by adding or dispersing it into a coating solution for the formation of the polymerizable layer. For dispersing the pigment in the coating solution, various dispersing techniques conventionally used for the preparation of ink or toner can be employed. As the dispersing device, there can be used a sand mill, an attritor, a pearl mill, a super mill, a ball mill, an impeller, a disperser, a KD mill, a colloid mill, a dynatron a three-roll mill and a press kneader. Details of the devices are described in "New Applied Technique of Pigments", (CMC Publishing, 1986).

Dyes can be employed as the coloring matter. As the dye, that is, a material being itself colored, there can be used those commercially available and those described in various publications (e.g., "Handbook of Dyes", Yuki Kagaku Kyokai (ed.,), 1970). Concrete examples of the dyes include azo dyes, metal complex salt azo dyes, pyrazolone azo dyes, anthraquinone dyes, quinoneimine dyes and methine dyes.

The amount of the coloring matter to be contained in the polymerizable layer widely varies depending on the absorbance of the used coloring matter, but preferably is in the range of about 0.1 to 30% by weight based on the whole amount of the polymerizable layer.

In the case of using a pigment as the coloring matter in the polymerizable layer, ethyl cellulose is preferably employed in combination as the binder polymer. Use of ethyl cellulose makes it possible to finely disperse the pigment in the polymerizable layer, and thereby a uniformly colored layer can be obtained. In this case, the molecular weight of the ethyl cellulose is preferably in the range of about 10,000 to 1,000,000, and more preferably 50,000 to 500,000. The amount of the ethyl cellulose is preferably in the range of 5 to 200% by weight, more preferably 20 to 100% by weight, based on the amount of the pigment.

Silver Halide

Examples of the silver halide employable for the light-sensitive material include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than about 0.01 μm, or may be relatively large sized grains having a grain diameter of projected area of up to about 10 μm. The silver halide emulsion may be a polydispersed emulsion or a monodispersed emulsion as described in U.S. Pat. Nos. 3,574,628 and 3,655,394, and U.K. Patent No. 1,413,748.

A tubular grain having an aspect ratio of not less than about 5 can be also employed. The tubular silver halide grains can be easily prepared by processes described in Gutoff, "Photographic Science and Engineering, Vol. 14, pp. 248–257 (1970)", U.S. Pat. Nos. 4,434,226, 4,414,310, 4,433,048 and 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide.

Various substances in the form of salt can be added to the silver halide according to a conventional process at the grain formation or after the grain formation. Examples of the substances include copper, thallium, lead, cadmium, zinc, a chalcogen such as sulfur, selenium and tellurium, gold, and a group III noble metal such as rhodium, iridium, iron, platinum and palladium. The conventional process is described in U.S. Pat. Nos. 1,195,432, 1,191,933, 2,448,060, 2,628,167, 2,950,972, 3,488,709, 3,737,313, 3,772,031, 4,269,927 and "Research Disclosure" (RD), No. 13,452 (June, 1975).

In the case that the light-sensitive material is exposed to light in a short time and at a high illuminance, iridium ion is preferably added to the silver halide in an amount of $10^{-8}$ to $10^{-3}$ mole, and more preferably in an amount of $10^{-7}$ to $10^{-5}$ mole based on 1 mole of silver halide.

Two or more kinds of silver halide grains which differ in halogen composition, crystal habit, grain size, and/or other features from each other can be employed in combination.

The silver halide is preferably employed in the form of an emulsion.

The silver halide emulsion employable in the light-sensitive material of the invention can be prepared by processes described, for example, in "Research Disclosure" (RD), No. 17,643, pp. 22–23 (Dec. 1978), (Emulsion preparation and types); and "Research Disclosure", No. 18,716, p. 648, (Nov. 1979).

The silver halide emulsion is generally used after subjecting it to physical ripening, chemical ripening and spectral sensitization. Various additives employable in those stages are described in "Research Disclosure", No. 17,643 and No. 18,716. The chemical sensitizing agent is described in No. 17,643 (p. 23) and No. 18,716 (p. 648, right side). The spectral sensitizing agent is described in No. 17,643 (pp. 23–24) and No. 18,716 (p. 648, right side). The supersensitizing agent is described in No. 18,716 (p. 649, right side). Other additives than the above-mentioned ones are also described in "Research Disclosure". For example, a sensitivity-increasing agent is described in No. 18,716 (p. 648, right side), and an antifogging agent and a stabilizer are described in No. 17,643 (pp. 24–25) and No. 18,716 (p. 649, right side), respectively.

It is preferred to use silver halide grains having a relatively low fogging value.

The silver halide emulsion may be a negative type. A reversal silver halide emulsion which directly forms a positive image can also be employed.

The amount of the silver halide is preferably in the range of 0.5 mg/m$^2$ to 5 g/m$^2$, more preferably 3 mg/m$^2$ to 0.5 g/m$^2$ in terms of silver.

In the invention, an organic metallic salt can be used as an oxidizing agent in combination with the light-sensitive silver halide in the light-sensitive layer. An organic silver salt is particularly preferred.

As an organic compound employable for forming the organic silver salt, there can be mentioned benzotriazoles described in U.S. Pat. No. 4,500,626 (pp. 52–53), aliphatic acids and other compounds. Also employable are silver salts of carboxylic acids having alkynyl group, such as silver phenylpropiolate described in Japanese Patent Provisional Publication No. 60(1985)-113235 and acetylene silver described in Japanese Patent Provisional Publications No. 61(1986)-249044 and No. 64(1989)-57256. The organic silver salt may be used in combination of two or more compounds.

The organic silver salt is generally used in an amount of 0 to 10 moles, preferably 0 to 1 mole per 1 mole of silver halide. The total amount of the light-sensitive silver halide and the organic silver salt contained in the light-sensitive layer is preferably in the range of 0.5 mg/m$^2$ to 5 g/m$^2$ in terms of silver.

Base and Base Precursor

Examples of the base precursor include inorganic or organic bases and their base precursors (e.g., decarboxylation type, thermal decomposition type, reaction type and complex salt-formation type).

As the inorganic base, employable are those described in Japanese Patent Provisional Publication No. 62(1987)-209448. As the organic base, employable are tertiary amine compounds described in Japanese Patent Provisional Publication No. 62(1987)-170954; bisamidine compounds, trisamidine compounds or tetraamidine compounds described in Japanese Patent Provisional Publication No. 63(1988)-316760; and bisguanidine compounds, trisguanidine compounds or tetraguanidine compounds described in Japanese Patent Provisional Publication No. 64(1989)-68746. In the invention, a base of not less than pKa 7 is preferred.

In the present invention, a base precursor is preferably employed from the viewpoint of storage stability of the light-sensitive material.

Preferred examples of the base precursors include salts of organic acids with bases which decarboxylate under heating as described in Japanese Patent Provisional Publications No. 63(1988)-316760, No.

64(1989)-68746, No. 59(1984)-180537 and No. 61(1986)-313431; and urea compounds which release bases under heating as described in Japanese Patent Provisional Publication No. 63(1988)-96159. Examples of processes for making the base precursor release a base through a certain reaction include a process comprising utilizing a reaction between the base precursor and a salt containing anion having higher compatibility with transition metal acetylide or transition metal ion than acetylide anion, as described in Japanese Patent Provisional Publication No. 63(1988)-25208; and a process comprising introducing into water both of a basic metallic compound which is hardly dissolved in water and a compound capable of reacting with metal ion of the basic metallic compound in a water medium to form a complex salt so as to release a base through a reaction between those two compounds in the presence of water, as described in Japanese Patent Provisional Publication No. 1(1989)-3282.

The base precursor employable in the invention preferably releases a base at a temperature ranging from 50° to 200° C., more preferably from 80° to 180° C.

The light-sensitive material employing a base or a base precursor is described in Japanese Patent Provisional Publication No. 62(1987)-264041. A light-sensitive material employing a tertiary amine as a base is described in Japanese Patent Provisional Publication No. 62(1987)-170954. A light-sensitive material employing dispersed grains of a hydrophobic organic base compound having a melting point of 80° to 180° C. is described in Japanese Patent Provisional Publication No. 62(1987)-209523. A light-sensitive material employing a guanidine derivative having a solubility of not more than 0.1% is described in Japanese Patent Provisional Publication No. 63(1988)-70845. A light-sensitive material employing hydroxides or salts of alkali metals or alkaline earth metals is described in Japanese Patent Provisional Publication No. 62(1987)-09448.

A light-sensitive material employing acetylide compounds as a base precursor is described in Japanese Patent Provisional Publication No. 63(1988)-24242. A light-sensitive material employing salts of propiolic acid as a base precursor and further containing silver, copper, a silver compound or a copper compound as a catalyst of the base production reaction is described in Japanese Patent Provisional Publication No. 63(1988)-46446. A light-sensitive material containing the salts of propiolic acid under the condition of being separated from the silver, copper, silver compound or copper compound is described in Japanese Patent Provisional Publication No. 63(1988)-81338. A light-sensitive material containing free ligands in addition to the salts of propiolic acid and the silver, copper, silver compound or copper compound is described in Japanese Patent Provisional Publication No. 63(1988)-97942. A light-sensitive material employing salts of the propiolic acid as a base precursor and further containing heat fusible compounds as an accelerator of the base production reaction is described in Japanese Patent Provisional Publication No. 63(1988)-46447. A light-sensitive material employing a salt of sulfonyl acetate as a base precursor and further containing heat fusible compound as an accelerator for the base production reaction is described in Japanese Patent Provisional Publication No. 63(1988)-48453. A light-sensitive material employing compounds in which isocyanate or isothiocyanate is bonded to an organic base is described in Japanese Patent Provisional Publication No. 63(1988)-96652. A light-sensitive material containing a nucleating agent as a decomposition accelerator of the above compounds is described in Japanese Patent Provisional Publication No. 63(1988)-173039.

A light-sensitive material employing as a base precursor a bisamidine or trisamidine salt of carboxylic acid capable of being decarboxylated is described in Japanese Patent Provisional Publication No. 64(1989)-9441. A light-sensitive material employing as a base precursor a bisguanidine or trisguanidine salt of carboxylic acid capable of being decarboxylated is described in Japanese Patent Provisional Publication No. 64(1989)-68749.

The base or the base precursor can be used in an amount of preferably 0.5 to 50 mole(s), more preferably 1 to 20 mole(s), per 1 mole of the silver halide.

Heat Development Accelerator

The heat development accelerator has been known as a thermal solvent, which serves to accelerate thermal decomposition of the base precursor or to accelerate development of the silver halide by dissolving the base or the reducing agent in the heating procedure. Examples of the heat development accelerator preferably employed in the invention include polyethylene glycols, derivatives of oleic esters of polyethylene oxide, bee wax, monostearic acid, and high dielectric compounds having —$SO_2$— group and/or —CO— group, as described in U.S. Pat. No. 3,347,675; polar substances as described in U.S. Pat. No. 3,667,959; and 1,10-decandiol, methyl anisate and biphenyl suberate, as described in "Research Disclosure" pp. 26–28, (Dec. 1976), a sulfonamide derivative as described in Japanese Patent Provisional Publication No. 62(1987)-151841, a polyethylene glycol derivative as described in Japanese Patent Provisional Publication No. 62(1987)-151743, a cyclic amide as described in Japanese Patent Provisional Publication No. 62(1987)-83450, a hot-melt compound as described in Japanese Patent Provisional Publications No. 63(1988)-243835 and No. 63(1988)-253934.

The heat development accelerator also has a function of increasing the plasticity of a polymer (which functions as a polymer binder, and is contained in the polymerizable layer, the light-sensitive layer or other layers) at a room temperature or at a heat development process. The heat development accelerator has been known as a plasticizer. The known plasticizers are described in "Plastic Additives (written in Japanese)", p. 21–63 (Taisei-sha); Plastice Additives, Second Edition; Hanser Publishers, Chapter 5, p. 251–296; Thermoplastic Additives, Marcel Dekker Inc., Chapter 9, p. 345–379; Plastic Additives, An Industrial Guide, Noyes Publications, Section 14, p. 333–485: The Technology of Solvents and Plasticizers, John Wiley & Sons Inc., Chapter 15, p. 903–1027; Industrial Plasticizers, Pergamom Press; Plasticizer Technology, Vol. 1, Reinhold Publishing corp.; and Plasticization and Plasticizer Process, American Chemistry.

Examples of the heat development accelerator include ureas such as urea, ethyleneurea, methylurea, dimethylurea, ethylurea and propyleneurea, amides such as acetamide and propionamide, sulfamides, sulfonamides, a polyhydric alcohol such as sorbitol, trimethylolethane, trimethylolpropane, pentaerithritol, glycerine, ethylene glycol, propylene glycol, butanediol and hexanediol, an urea resin, a phenol resin. Two or more heat development accelerators can be used in combination.

Hydrophilic Binder Polymer

A hydrophilic binder polymer may be contained in the light-sensitive layer, the image formation accelerating layer or the protective layer. The hydrophilic binder polymer has a hydrophilic group or a hydrophilic bond in its molecule. Examples of the hydrophic group include carboxyl, hydroxyl (including alcohol and phenol), sulfo, sulfonamido, sulfonimido and amido. Examples of the hydrophilic bond include urethane bond, ether bond and amido bond.

The hydrophilic polymer preferably is soluble in water or swells in water. The polymer which swells in water has an affinity to water, but is not soluble in water because of the cross-linking structure of the polymer.

The natural or synthetic polymers can be used as the hydrophilic polymer. Examples of the natural hydrophilic polymer include polysaccharide such as-starch derivatives, cellulose derivatives, alginic acid, pectic acid, gum arabic and pullulan, and protein such as casein and gelatin. The denatured polymers can also be used. In preparation of the light-sensitive material (at the stage of coating or drying), these natural polymers can be denatured or cross-linked. The synthetic hydrophilic polymer is a polymer or copolymer of water-soluble monomers. The water-soluble monomers has a hydrophilic group such as carboxyl, acid anhydride, hydroxyl, sulfo (includes a salt thereof), amido, amino and ether. Examples of the monomer are described in "Application and Market of Water-soluble Polymer" (CMC, p. 16-18). A copolymer formed from the above-mentioned monomers by polymerization or cross-linking (cf., copolymers described in U.S. Pat. No. 4,913,998) is also available.

The other examples of the hydrophilic polymer binder include polyvinyl alcohol, polyvinyl ether, polyvinyl pyrrolidone and derivatives thereof. Polyvinyl alcohol is particularly preferred.

Polyvinyl alcohol may be denatured by copolymerization with another monomer. A copolymer of vinyl acetate and another monomer is saponified to form the denatured polyvinyl alcohol. Examples of the monomer copolymerized with the vinyl acetate include ethylene, a higher vinyl carboxylate, a higher alkyl vinyl ether, methyl methacrylate and acrylamide. Polyvinyl alcohol may also be denatured after the saponification. The hydroxyl group in polyvinyl alcohol can be modified by etheration, esterification or acetalation. A cross-linked polyvinyl alcohol is also available. Examples of the cross-linking agent include aldehyde, methylol compounds, diisocyanate, divinyl compounds, dicarboxylic acids, borates, titanium and copper. The denatured or cross-linked polyvinyl alcohol is described in "Poval" 3rd ed., Kobunshi Kanko-Kai, p. 281-285 and 256-260.

The molecular weight of the polymer is preferably in the range of 3,000 to 500,000. The hydrophilic polymer binder is preferably used in an amount in the range of 0.05 g to 20 g/m$^2$, more preferably in the range of 0.1 to 10 g/m$^2$, and most preferably in the range of 0.3 to 3 g/m$^2$.

It is preferred that the uppermost layer effectively prevents oxygen from diffusing from the air to the polymerizable layer at the heat development process. The oxygen functions as a polymerization inhibitor. Therefore, the hydrophilic polymer binder preferably has a low transmission coefficient of oxygen of not more than $1.0 \times 10^{-11}$ cm$^3$·cm/cm$^2$·sec·cmHg.

The examples of the hydrophilic polymer binder having the low transmission coefficient of oxygen include polyvinyl alcohol and its derivatives, gelatin and copolymer of vinylidene chloride. The derivatives of polyvinyl alcohol include the above-mentioned denatured polyvinyl alcohol (formed by saponification of the block copolymer of polyvinyl acetate and another monomer). The molecular weight is preferably in the range of 3,000 to 500,000.

Polyvinyl alcohol preferably has a high saponification degree of not less than 70%, more preferably of not less than 80%, most preferably of not less than 95%. The hydrophilic polymer binder is preferably used in an amount in the range of 0.5 g to 10 g/m$^2$, and more preferably in the range of 1.0 g to 5 g/m$^2$. The molecular weight is preferably in the range of 3,000 to 500,000.

Other Additives

The light-sensitive material can contain various anti-fogging agents and stabilizers. Examples of the anti-fogging agents and the stabilizers include azoles and azaindenes described in "Research Disclosure" pp. 24-25 (1978); carboxylic acids containing nitrogen and phosphoric acids containing nitrogen described in Japanese Patent Provisional Publication No. 59(1984)-168442; mercapto compounds and their metallic salts described in Japanese Patent Provisional Publication No. 59(1984)-111636; and acetylene compounds described in Japanese Patent Provisional Publication No. 62(1987)-87957. The anti-fogging agent can be contained in the polymerizable layer, but preferably is contained in the light-sensitive layer. The anti-fogging agent is generally employed in an amount of $10^{-7}$ to 1 mole per 1 mole of the silver halide.

Reducing Agent

The reducing agent has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind or amount of the above reducing agent, the polymerizable compound can be polymerized within the area where a latent image of the silver halide has been formed or the area where a latent image of the silver halide has not been formed.

Various reducing agents having the above-mentioned functions (including compounds referred to as developing agent or hydrazine derivative) are described in Japanese Patent Provisional Publications 61(1986)-183640, No. 61(1986)-183535, No. 61(1986)-228441, No. 62(1987)-70836, No. 61(1987)-86354, No. 62(1987)-86355, No. 62(1987)-206540, No. 62(1987)-264041, No. 62(1987)-109437 and No. 63(1988)-254442, and Japanese Patent Applications No. 63(1988)-97379, No. 63(1988)-296774, No.

63(1988)-296775, No. 1(1989)-27175, No. 1(1989)-54101 and NO. 1(1989)-91162. These reducing agents are also described in T. James, "The Theory of the Photographic Process", 4th edition, pp. 291-334 (1977), "Research Disclosure", Vol. 170, No. 17029, pp. 9-15 (June 1978), and "Research Disclosure", Vol. 176, No. 17643, pp. 22-31 (December 1978). Further, there can be also employed a reducing agent precursor capable of releasing a reducing agent under heating or in contact with a base. Also in the light-sensitive material of the invention, various reducing agents and reducing agent precursors described in the above publications, applications and literatures can be effectively employed. Thus, "the reducing agent(s)" in the present specification means to include all of the reducing agents and reducing agent precursors described in the above publications.

When the reducing agent is basic, that is, it forms a salt with an acid, the reducing agent can be used in the form of a salt of an appropriate acid. These reducing agents can be used singly or in combination. In the case that two or more reducing agents are used in combination, certain interactions between those reducing agents may be expected. One of the interactions is an acceleration of reduction of silver halide (and/or an organic silver salt) through so-called super-additivity. Another interaction is a chain reaction in which an oxidant of one reducing agent formed by a reaction with silver halide (and/or an organic silver salt) induced or inhibits the polymerization of the polymerizable compound via oxidation-reduction reaction with other reducing agent. Both interactions may occur simultaneously. Thus, it is difficult to determine which of the interactions has occurred in practical use.

The reducing agent is used in an amount of 0.1 to 10 mole, more preferably 0.5 to 10 mole, most preferably 0.5 to 5 mole, and particularly preferably 1 to 5 mole, per 1 mole of the silver halide.

Concrete examples of the reducing agents are described below.

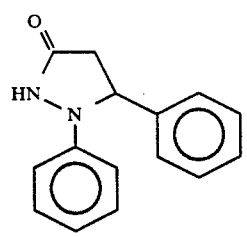
(1)

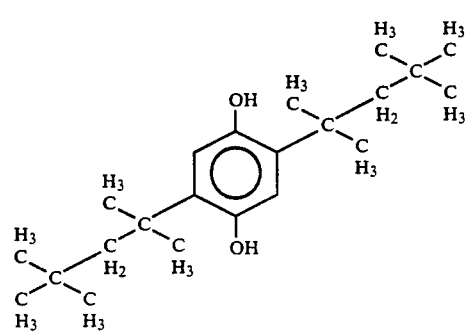
(2)

-continued

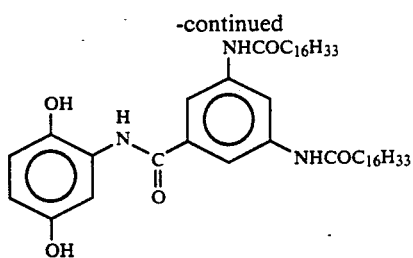
(3)

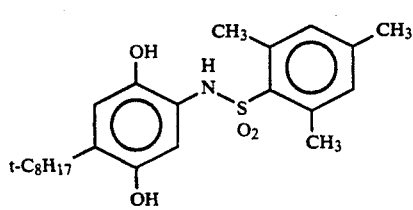
(4)

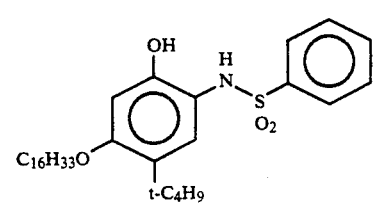
(5)

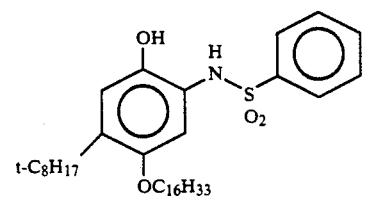
(6)

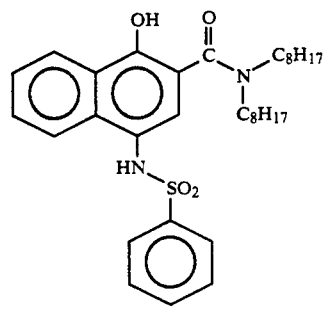
(7)

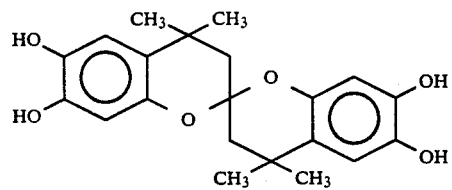
(8)

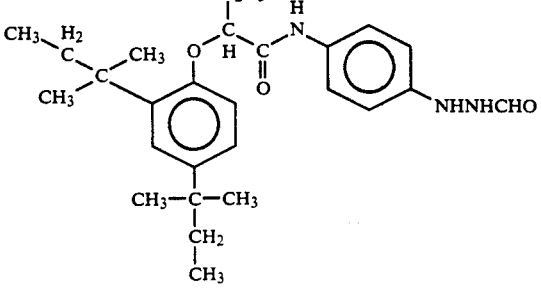
(9)

-continued

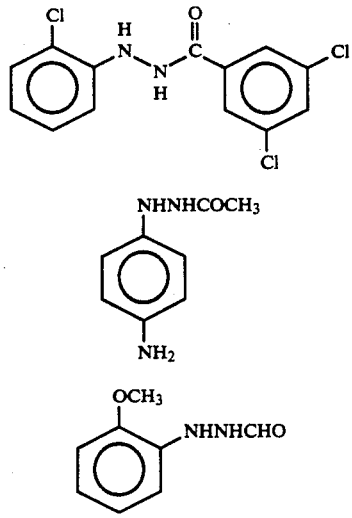

When hydrazines are used as the reducing agent singly or in combination with other reducing agent, the polymerizable compound is polymerized within the area where a latent image of the silver halide has been formed. When 1-phenyl-3-pyrazolidones, hydroquinones and sufonamidephenols are used as the reducing agent and hydrazines are not used in combination, the polymerizable compound is polymerized within the area where a latent image of the silver halide has not been formed. In this case, however, it is required to incorporate a polymerization initiator which is decomposed under heating or light-irradiation to generate radical into the light-sensitive layer or the polymerizable layer.

Polymerization Initiator

A thermal polymerization initiator is described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds such as azobisisobutyronitrile, 1,1'-azobis(1-cyclohexanecarbonitrile), dimethyl 2,2'-azobisisobutyrate, 2,2'-azobis(2-methylbutyronitrile) and azobisdimethylbaleronitrile; organic peroxides such as benzoyl peroxide, di-t-butyl peroxide, dicumyl peroxide, t-butyl hydroperoxide and cumene hydroperoxide; inorganic peroxides such as hydrogen peroxide, potassium persulfate and ammonium persulfate; and sodium p-toluenesulfinic acid.

The photopolymerization initiator is described in Oster et al., Chemical Review, vol. 68, p. 125–151 (1968) and Kosar, Light-Sensitive System, p. 158–193, John Wiley & Sons (1965). Examples of the photopolymerization initiator include carbonyl compounds (e.g., α-alkoxyphenyl ketones, polycyclic quinones, benzophenone derivatives, xanthones, thioxanthones and benzoines), halogen-containing compounds (e.g., chlorosulfonyl or chloromethyl polynuclear aromatic compounds, chlorosulfonyl or chloromethyl heterocyclic compounds, chlorosulfonyl or chloromethyl benzophenones and fluorenones), haloalkanes, α-halo-α-phenylacetophenones, redox couples of photo-reducible dye and reducing agent, organic sulfur compounds, peroxides, photo semi-conductors (e.g., titanium dioxide and zinc oxide), metallic compounds (e.g., ferrous salt, metallic salt of carbonyl compound, metal complex and uranyl salt), silver halide, azo compounds and diazo compounds.

Concrete examples of the photopolymerization initiators include 2-dimethoxy-2-phenylacetophenone, 2-methyl-[4-(methylthio)phenyl]-2-morpholino-1-propanone, benzoin butyl ether, benzoineisopropyl ether, benzophenone, Michler's ketone, 4,4-diethylaminobenzophenone, chloromethylbenzophenone, chlorosulfonylbenzophenone, 9,10-anthraquinone, 2-methyl--9,10-anthraquinone, chlorosulfonyl anthraquinone, chloromethyl anthraquinone, 9,10-phenanthrenequinone, xanthone, chloroxanthone, thioxanthone, chlorothioxanthone, 2,4-diethylthioxanthone, chlorosulfonylthioxanthone, chloromethylbenzothiazole, chlorosulfonylbenzoxazole, chloromethylquinoline, fluorene and tetracarbon tetrabromide. Examples of the photo-reducible dyes include methylene blue, thionine, rose bengal, erythrocin-β, eosine, rhodamine, phloxin-β, safranine, acryflavine, riboflavine, fluorescein, uranine, benzoflavine, acryzine orange, acryzine yellow and benzanthrone.

Examples of the reducing agents (hydrogen donative compounds) employable with these dyes include β-diketones (e.g., dimedone and acetylacetone), amines (e.g., triethanolamine, diethanolamine, monoethanolamine, diethylamine and triethylamine), sulfinic acids (e.g., p-toluenesulfinic acid and benzenesulfinic acid), salts of those sulfinic acids, N-phenylgrycine, L-ascorbic acid and salts thereof, thiourea, and allylthiourea.

A molar ratio between the photo-reducible dye and the reducing agent is preferably in the range of 1:0.1 to 1:10.

Also preferably employable as the photopolymerization initiator are commercially available ones such as Irgacure-651 ™ and Irgacure-907 ™ (produced by Ciba Geigy).

The photopolymerization initiator is used in an amount of preferably 0.001 to 0.5 g, more preferably 0.01 to 0.2 g, per 1 g of the polymerizable compound.

The image forming system using a polymerization initiator is described in Japanese Patent Provisional Publications No. 61(1986)-75342, No. 61(1986)-243449, No. 62(1987)-70836 and No. 62(1987)-81635, U.S. Pat. No. 4,649,098, and European Patent No. 0202490.

Development Stopping Agent

A variety of development stopping agents can be employed in the light-sensitive material for the purpose of constantly obtaining uniform images in spite of temperatures and period of time for the development process. The development stopping agents used herein are compounds to neutralize a base or react with a base to reduce the base concentration in the layer to hereby stop development, or compounds that mutually react with silver or a silver salt to suppress development, after the appropriate development. More specifically, examples of the development stopping agents include acid precursors capable of releasing acids upon heating, electrophilic compounds capable of undergoing substitution reaction with a coexisting base upon heating, nitrogen-containing heterocyclic compounds, mercapto compounds, and precursors thereof. Examples of the development stopping agents are described in detail in Japanese Patent Provisional Publication No. 62(1987)-253159 (pp. 31– 32), and Japanese Patent Applications No. 1(1989)-72479 and No. 1(1989)-3471. The development stopping agent can be contained in any of the layers.

Surface Active Agent

A surface active agent can be contained in each of the layers. Examples of the surface active agent include non-ionic, anionic and cationic agent (disclosed in Japanese Patent Provisional Publication No. 2-195356). Sorbitan, polyoxyethylene and a fluorine-containing compound are preferred.

An image forming method utilizing the light-sensitive material of the invention (namely, a process for the preparation of a lithographic printing plate) is described below.

Imagewise Exposure

A process for the preparation of a lithographic printing plate comprises a step of imagewise exposure of the light-sensitive material, a step of developing the light-sensitive material simultaneously with or after the imagewise exposure, a step of further heating or irradiating the light-sensitive material with a light in the case of polymerizing the polymerizable compound within the area where a latent image of the silver halide has not been formed, and a step of dissolving and removing the unhardened portion (non-image portion) with an alkaline aqueous solution or an appropriate solvent.

The exposure of the light-sensitive material can be made using a light source capable of emitting a light corresponding to a spectral sensitivity (of sensitizing dye) of the silver halide. Examples of such light sources include various lamps (e.g., a tungsten lamp, a halogen lamp, a xenon lamp, a mercury lamp and a carbon arc lamp), various lasers (e.g., a semiconductor laser, a helium neon laser, an argon laser and a helium cadmium laser), light emission diode, and a CRT tube. A light for the exposure preferably is a visible light, a near ultraviolet ray or a near infrared ray. The exposure is generally determined by a sensitivity of the silver halide emulsion, and the amount therefor is preferably in the range of 0.01 to 10,000 ergs/cm$^2$, more preferably 0.1 to 1,000 ergs/cm$^2$.

In the case that the support is transparent, the light-sensitive material can be exposed to light on the side of the transparent support.

The light-sensitive material is imagewise exposed using the above-mentioned light sources to form a latent image of the silver halide on the exposed portion.

Development Process

Simultaneously with or after the above-described imagewise exposure, the light-sensitive material is subjected to a development process.

The light-sensitive material of the invention can be developed by a wet development process using a developing solution. However, a heat (dry) development process is preferred to the wet development process.

The heat development can be conducted by bringing the light-sensitive material into contact with a heated material (e.g., heated plate or roller), heating the light-sensitive material by a radiation heat of an infrared rays lamp, or immersing the light-sensitive material in a heated medium such as a heated oil. For preventing polymerization inhibition caused by the entered oxygen of air during the heating stage, the light-sensitive material is preferably heated under such conditions that the surface of the light-sensitive material is covered with a material that hardly transmits oxygen. For example, the light-sensitive surface of the light-sensitive material is brought into close contact with a heated material. The temperature for the heating is preferably in the range of 60° to 200° C., more preferably 100° to 150° C. The heating time is preferably in the range of 1 to 180 seconds, and more preferably 5 to 60 seconds. Through the above-described heat development process, the polymerizable compound is polymerized and hardened within the area where a latent image of the silver halide has been formed or the area where a latent image of the silver halide has not been formed, to form a polymer image on the polymerizable layer. It is unnecessary to an other heating for polymerizing the polymerizable compound within the area where a latent image of the silver halide has not been formed, that is, it is enough to conduct heating during only the development process. Light-irradiation for developing the light-sensitive material can be conducted by a similar manner to that of the aforementioned imagewise exposure, but in this case, a light different from that for the exposure in the wavelength and the light amount is employed.

Treatment After Development Process

After the development process, the unhardened portion (non-image portion) is washed out with an alkaline aqueous solution (e.g., aqueous solution of triethanol amine) to dissolve and remove (i.e., etch) that portion. Through this washing procedure, the light-sensitive layer and the unhardened portion of the polymerizable layer are removed to form a relief image made of the hardened portion of the polymerizable layer on the support.

The etching solution preferably contains an alkaline compound. Examples of the alkaline compound include sodium hydroxide, potassium hydroxide, sodium carbonate, sodium silicate, potassium silicate, sodium metasilicate, potassium metasilicate, sodium phosphate, ammonia, monoethanolamine, diethanolamine and triethanolamine.

The solvent of the etching solution is water or an organic solvent. Water is preferred to the organic solvent. Further, water and an organic solvent can be used in combination. Examples of the organic solvent include methanol, ethanol, propanol, butanol, benzyl alcohol, phenetyl alcohol, ethylene glycol, diethylene glycol, triethylene glycol, polyethylene glycol, cellosolves, monoethanolamine, diethanolamine and triethanolamine. A surface active agent, defoaming agent or other additives can be added to the etching solution. The etching solution is commercially available as a developing solution for printing plate.

When the light-sensitive material is immersed in the etching solution, all of the light-sensitive layer and the image formation accelerating layer, and the unhardened potion of the polymerizable layer are dissolved in the solution. The light-sensitive layer and the image formation accelerating layer may be removed by water or by pealing apart before immersing in the etching solution to remove the unhardened polymerizable layer.

To form a visible polymer image, there are various processes other than the above-mentioned process using the etching solution. For example, after the light-sensitive layer (and the protective layer) is removed, the unhardened polymerizable layer can be transferred to another image receiving sheet to form an image on the sheet. Further, a colored substance (toner) can be added to the unhardened polymerizable layer. Furthermore, the hardened or unhardened polymerizable layer can be selectively dyed.

The obtained image can be used as a printing plate, a color proof, a hard copy or a relief. The printing plate is the most suitable use because the light-sensitive material of the invention has a high sensitivity and the process of the invention forms a polymer image having a high mechanical strength.

The present invention is further described by the following examples without limiting the invention.

EXAMPLE 1

Preparation of Aluminium Support

A surface of an aluminium sheet having thickness of 0.30 mm was grained using a nylon brush and an aqueous suspension of pumice stone of 400-in mesh, and then sufficiently washed out with water. The aluminium sheet was then immersed for etching in 10% aqueous solution of sodium hydroxide at 70° C. for 60 seconds. Thereafter, the sheet was washed out with running water, then neutralized with 20% aqueous solution of nitric acid and washed out with water. The aluminium sheet was subjected to an electrolytic surface-roughening treatment in 1% aqueous solution of nitric acid in an anodically electric amount of 160 coulomb/dm² using sine wave alternating-corrugated current under such conditions as an anodic voltage of 12.7 V and a cathodically electric amount ratio to an anodically electric amount of 0.8. The center line average height (Ra) of the aluminium sheet was 0.6 μm. Subsequently, the aluminium sheet was immersed in 30% aqueous solution of sulfuric acid at 55° C. for 2 minutes to remove smuts, and then subjected to anodizing in 20% aqueous solution of sulfuric acid at a current density of 2 A/dm² to give an anodized layer having a thickness of 2.7 g/dm².

Preparation of Polymerizable Layer

The following coating solution was coated over the aluminum support, and the coated layer of the solution was dried to form a polymerizable layer having a dry thickness of about 1.3 μm on the support.

| (Coating solution) | |
|---|---|
| Dipentaerythritol hexaacrylate | 2.5 g |
| 20 Weight % propylene glycol monomethyl ether solution of allyl methacrylate/methacrylic acid copolymer (copolymerization ratio = 83/17) | 37.5 g |
| The following Pigment dispersion | 13.0 g |
| Methyl ethyl ketone | 74.0 g |
| (Pigment dispersion) | |
| Chromophthal-Red A2B | 18.0 g |
| Benzyl methacrylate/methacrylic acid copolymer (copolymerization ratio = 80/20) | 12.0 g |
| Cyclohaxanone | 30.0 g |
| Propylene glycol monomethyl ether | 40.0 g |

Preparation of Silver Halide Emulsion

In 1,500 ml of water were dissolved 16 g of gelatin and 0.5 g of sodium chloride, and the resulting gelatin solution was adjusted to pH 3.2 using 1N-sulfuric acid and was kept at 50° C. To the gelatin solution, 300 ml of an aqueous solution containing 71 g of potassium bromide and 300 ml of an aqueous solution containing 0.59 mole of silver nitrate were added simultaneously at the same feed rate over 50 minutes under stirring the gelatin solution. After 1 minute, to the resulting mixture was further added 200 ml of aqueous solution containing 4.3 g of potassium iodide at a fixed feed rate over 5 minutes. To the resulting emulsion was then added 1.2 g of a polyisobutylene/monosodium maleate copolymer.

After the emulsion was washed out with water for desalting, 24 g of gelatin was added to the emulsion. Further, to the resulting emulsion were added 5 mg of sodium thiosulfate and 0.47 g of the following sensitizing dye to chemically sensitize the emulsion at 60° C. for 15 minutes. Thus, a silver halide emulsion (yield: 1,000 g) was obtained.

(Sensitizing dye)

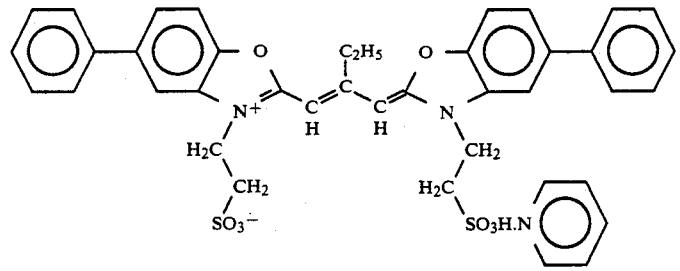

Preparation of Reducing Agent Dispersion

In 90 g of 3 weight % aqueous solution of polyvinyl alcohol (PVA-205, tradename of Kuraray Co., Ltd.) was dispersed 10 g of powder of the following reducing agent using Dynomill dispersing device. The particle size of the reducing agent was not more than about 0.5 μm.

(Reducing agent)

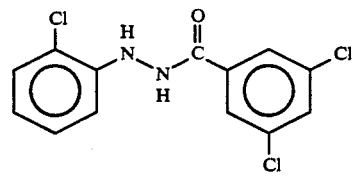

Preparation of Light-Sensitive Layer

The following coating solution was coated over the above-prepared polymerizable layer, and the coated layer of the solution was dried to give a light-sensitive layer having a dry thickness of about 1.2 μm. No precipitation was observed in the coating solution of the light-sensitive layer, even if the solution was left for one day at room temperature.

| (Coating solution) | |
|---|---|
| 10 Weight % aqueous solution of polyvinyl alcohol (PVA-405, tradename of Kuraray Co., Ltd., saponification degree: 81.5%) | 42.0 g |
| The above-prepared reducing agent dispersion | 9.0 g |
| Ethylene urea (Heat development accelerator) | 2.0 g |
| 0.13 Weight % methanol solution of the following additive-1 | 5.4 g |
| 0.22 Weight % methanol solution of the following additive-2 | 5.4 g |
| The above-prepared silver halide emulsion | 3.7 g |
| 5 Weight % aqueous solution of the following surface active agent | 9.0 g |
| Water | 106.0 g |

(Additive-1)

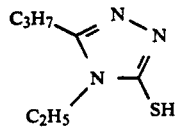

(Additive-2)

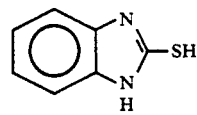

(Surface active agent)

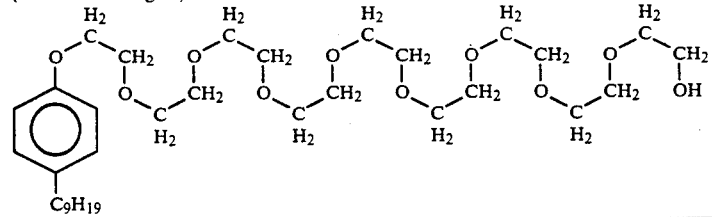

Preparation of Base Precursor Dispersion

In 750 g of 3 weight % aqueous solution of polyvinyl alcohol was dispersed 250 g of the following base precursor using Dynomill dispersing device. The particle size of the base precursor was about not more than 0.5 μm.

(Base precursor)

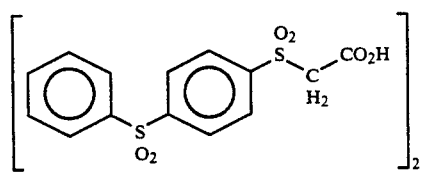

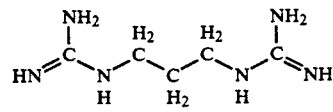

Preparation of Image Formation Accelerating Layer

The following coating solution was coated over the above-prepared light-sensitive layer, and the coated layer of the solution was dried to give an image formation accelerating layer having a dry thickness of about 3.3 μm. Thus a light-sensitive material of the present invention (presensitized printing plate) was prepared.

| (Coating solution) | |
|---|---|
| 10 Weight % aqueous solution of polyvinyl alcohol (PVA-110, tradename of Kuraray Co., Ltd., saponification degree: 98.5%) | 200.0 g |
| The above-prepared base precursor dispersion | 12.5 g |
| Ethylene urea (Heat development accelerator) | 2.0 g |
| 5 Weight % aqueous solution of the surface active agent used in the preparation of the light-sensitive layer | 4.0 g |

Image Formation and Evaluation Thereof

The light-sensitive material was brought into close contact with an original image film, and the material was exposed to light of a tungsten lamp of 500 W at 50 lux for 1 second. Then, the back surface of the light-sensitive material (i.e., free surface side of the aluminum support) was brought into close contact with a hot plate heated to 130° C. under the condition that the image formation accelerating layer side surface was opened to air, to thermally develop the material for 30 seconds. Thus, a silver image was found on the exposed portion. No bubble was observed on the surface of the light-sensitive layer.

Thereafter, the light-sensitive material was immersed in Fuji PS developing solution DN-3C (available from Fuji Photo Film Co., Ltd.) at room temperature for 1 minute and then sufficiently washed out with water, to remove all of the image formation accelerating layer and the light-sensitive layer and the unexposed portion of the polymerizable layer. Thus, a relief polymer image of red color was formed on the exposed portion. When the obtained printing plate was mounted on a Heidelberg KOR-D type printing machine to perform a printing operation. As a result, an excellent print was obtained.

Further, the light-sensitive material was stored at 50° C. for 1 week, and then an image was formed using the stored light-sensitive material. As a result, an excellent image was also obtained.

EXAMPLE 2

A light-sensitive material was prepared in the same manner as in Example 1, except that sorbitol was used as a heat development accelerator in place of ethylene urea (same amount) contained in the light-sensitive layer and the image formation accelerating layer. The light-sensitive material was evaluated in the same manner as in Example 1. As a result, clear image and print were obtained.

EXAMPLE 3

A light-sensitive material was prepared in the same manner as in Example 1, except that 9.0 g of the reducing agent dispersion was added to the image formation accelerating layer in place of the light-sensitive layer. The light-sensitive material was evaluated in the same manner as in Example 1. As a result, clear image and print were obtained.

COMPARISON EXAMPLE 1

A polymerizable layer was formed in a support in the same manner as in Example 1.

The following coating solution was coated over the polymerizable layer, and the coated layer of the solution was dried to give a light-sensitive layer having a dry thickness of about 1.2 μm. Precipitation of the base precursor was observed in the coating solution of the light-sensitive layer, when the solution was left for one day at room temperature. Accordingly, the coating solution should be immediately used (within one hour).

| (Coating solution) | |
|---|---|
| 10 Weight % aqueous solution of polyvinyl alcohol (PVA-405, tradename of Kuraray Co., Ltd., saponification degree: 81.5%) | 42.0 g |
| The base precursor dispersion used in Example 1 | 12.5 g |
| The reducing agent dispersion used in Example 1 | 9.0 g |
| Ethylene urea (Heat development accelerator) | 4.0 g |
| 0.13 Weight % methanol solution of the additive-1 used in Example 1 | 5.4 g |
| 0.22 Weight % methanol solution of the additive-2 used in Example 1 | 5.4 g |
| The silver halide emulsion used in Example 1 | 3.7 g |
| 5 Weight % aqueous solution of the surface active agent used in Example 1 | 9.0 g |
| Water | 93.0 g |

The following coating solution was then coated over the above-prepared light-sensitive layer, and the coated layer of the solution was dried to give an overcoating layer having a dry thickness of about 3.0 μm. Thus a comparative light-sensitive material (presensitized printing plate) was prepared.

| (Coating solution) | |
|---|---|
| 10 Weight % aqueous solution of polyvinyl alcohol | 200.0 g |

| -continued | |
|---|---|
| (Coating solution) | |
| (PVA-110, tradename of Kuraray Co., Ltd., saponification degree: 98.5%) | |
| 5 Weight % aqueous solution of the surface active agent used in Example 1 | 4.0 g |

The prepared light-sensitive material was evaluated in the same manner as in Example 1. Bubbles were observed in the overcoating layer or the light-sensitive layer when the light-sensitive material was heat-developed. A fairly clear image was obtained. However, there were some distortion in the image, which corresponds to the bubbles.

Further, the light-sensitive material was stored at 50° C. for 1 week, and then an image was formed using the stored light-sensitive material. As a result, the sensitivity of the light-sensitive material was decreased.

EXAMPLE 4

A light-sensitive material was prepared in the same manner as in Example 1, except that 2.0 g of the reducing agent was added to the coating solution of the polymerizable layer, and the reducing dispersion was not added to the light-sensitive layer. The light-sensitive material was evaluated in the same manner as in Example 1. As a result, clear image and print were obtained.

I claim:

1. A light-sensitive material which contains silver halide, a reducing agent and at least one of an ethylenically unsaturated polymerizable compound and a cross-linkable polymer,
    wherein the light-sensitive material comprises a support and at least three image forming functional layers including a light-sensitive layer, a polymerizable layer and an image formation accelerating layer, said light-sensitive layer containing silver halide, said polymerizable layer containing at least one of said ethylenically unsaturated polymerizable compound and said cross-linkable polymer, said image formation accelerating layer containing a base precursor, and said image formation accelerating layer being the uppermost layer among the three image forming functional layers, and
    wherein the reducing agent forms at least one of an oxidation product or radical thereof when the silver halide is developed, and said at least one oxidation product or radical thereof initiates a hardening reaction of said at least one of the polymerizable compound and the cross-linkable polymer.

2. The light-sensitive material as claimed in claim 1, wherein the image formation accelerating layer further contains a heat development accelerator.

3. The light-sensitive material as claimed in claim 1, wherein the light-sensitive material comprises, in the following order, the support, the polymerizable layer, the light-sensitive layer, and the image formation accelerating layer.

4. The light-sensitive material as claimed in claim 1, wherein the image formation accelerating layer further contains a polyvinyl alcohol having a saponification degree of not less than 70%.

5. The light-sensitive material as claimed in claim 1, wherein a protective layer is provided on the image formation accelerating layer, and the protective layer contains a polyvinyl alcohol having a saponification degree of not less than 70.

6. The light-sensitive material as claimed in claim 1, wherein the support is an aluminium sheet.

7. The light-sensitive material as claimed in claim 1, wherein the silver halide is contained in the light-sensitive layer in a coating amount of 1 mg to 5 g/m$^2$ in terms of silver.

8. The light-sensitive material as claimed in claim 1, wherein the reducing agent is contained in an amount of 0.1 to 10 mole based on 1 mole of the silver halide.

9. The light-sensitive material as claimed in claim 1, wherein the polymerizable compound is contained in the polymerizable layer in an amount of 3 to 90 weight % based on the amount of polymerizable layer.

10. The light-sensitive material as claimed in claim 1, wherein the cross-linkable polymer is contained in the polymerizable layer in an amount of 0.1 to 7 g/m$^2$.

11. The light-sensitive material as claimed in claim 1, wherein the base precursor is contained in an amount of 0.5 to 50 mole based on 1 mole of the silver halide.

12. The light-sensitive material as claimed in claim 1, wherein the polymerizable layer has a thickness in the range of 0.3 to 7 μm.

13. The light-sensitive material as claimed in claim 1, wherein the light-sensitive layer has a thickness in the range of 0.5 to 20 μm.

14. The light-sensitive material as claimed in claim 1, wherein the image formation accelerating layer has a thickness in the range of 0.3 to 20 μm.

15. An image forming method which comprises the steps of:
    imagewise exposing to light a light-sensitive material which contains silver halide, a reducing agent, at least one of an ethylenically unsaturated polymerizable compound and a cross-linkable polymer, and at least one of a base and a base precursor,
    wherein the light-sensitive material comprises a support and at least three image forming functional layers including a light-sensitive layer, a polymerizable layer and an image formation accelerating layer, said light-sensitive layer containing silver halide, said polymerizable layer containing at least one of said ethylenically unsaturated polymerizable compound and said cross-linkable polymer, said image formation accelerating layer containing a base precursor, and said image formation accelerating layer being the uppermost layer among the three image forming functional layers; and
    simultaneously or thereafter heating the light-sensitive material at a temperature in the range of 60° to 200° C. under conditions substantially not containing water to develop the silver halide, wherein the reducing agent forms an oxidation product or radical thereof when the silver halide is developed, the oxidation product or radical thereof is transferred from the light-sensitive layer to the polymerizable layer, said at least one polymerizable compound and cross-linkable polymer is imagewise hardened by said oxidation product or radical thereof, a polymer image is formed by said imagewise hardening of said at least one polymerization compound and cross-linkable polymer, and said imagewise hardening is initiated by said oxidation product or radical thereof.

16. The image forming method as claimed in claim 15, wherein the light-sensitive material is heated while the surface of the light-sensitive material is open to the air.

17. The image forming method as claimed in claim 15, wherein the light-sensitive material is heated while the surface of the light-sensitive material is shielded from the air.

18. The image forming method as claimed in claim 15, wherein, after the polymer image is formed, the light-sensitive material is washed-out with an aqueous solution to remove the layers other than the polymerizable layer and the unhardened polymerizable layer.

19. The image forming method as claimed in claim 15, wherein the image formation accelerating layer further contains a heat development accelerator.

* * * * *